(12) United States Patent
Park et al.

(10) Patent No.: US 8,853,703 B2
(45) Date of Patent: Oct. 7, 2014

(54) THIN FILM TRANSISTOR ARRAY PANEL

(71) Applicant: Samsung Display Co., Ltd., Yongin (KR)

(72) Inventors: Ji-Young Park, Hwaseong-si (KR); Yu-Gwang Jeong, Yongin-si (KR); Sang Gab Kim, Seoul (KR); Joon Geol Lee, Asan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/830,269

(22) Filed: Mar. 14, 2013

(65) Prior Publication Data
US 2014/0117361 A1 May 1, 2014

(30) Foreign Application Priority Data

Nov. 1, 2012 (KR) .................. 10-2012-0123209

(51) Int. Cl.
| | | |
|---|---|---|
| H01L 29/04 | (2006.01) | |
| H01L 29/15 | (2006.01) | |
| H01L 31/036 | (2006.01) | |
| H01L 29/10 | (2006.01) | |
| H01L 31/0376 | (2006.01) | |
| H01L 31/20 | (2006.01) | |
| H01L 31/062 | (2012.01) | |
| H01L 31/113 | (2006.01) | |
| H01L 29/786 | (2006.01) | |
| H01L 29/66 | (2006.01) | |

(52) U.S. Cl.
CPC .... H01L 29/78669 (2013.01); H01L 29/78678 (2013.01); H01L 29/66765 (2013.01)
USPC ........ 257/72; 257/59; 257/291; 257/E29.117; 257/E29.151; 257/E29.273

(58) Field of Classification Search
CPC ............ H01L 27/3262; H01L 29/4908; H01L 29/41733; H01L 29/42384; H01L 29/66765
USPC .............. 257/59, 72, 291, E29.117, E29.151, 257/E29.273
See application file for complete search history.

(56) References Cited

U.S. PATENT DOCUMENTS

| 6,927,832 B2 | 8/2005 | Cho |
| 7,408,597 B2 | 8/2008 | Lee et al. |

(Continued)

FOREIGN PATENT DOCUMENTS

| KR | 1020110053034 | 5/2011 |
| KR | 1020110066737 | 6/2011 |

(Continued)

OTHER PUBLICATIONS

See US20130020591 corresponding to KR1020130011856.

Primary Examiner — Ida M Soward
(74) Attorney, Agent, or Firm — F. Chau & Associates, LLC

(57) ABSTRACT

A thin film transistor array panel includes a substrate, gate lines, each including a gate pad, a gate insulating layer, data lines, each including a data pad connected to a source and drain electrode, a first passivation layer disposed on the data lines and the drain electrode, a first electric field generating electrode, a second passivation layer disposed on the first electric field generating electrode, and a second electric field generating electrode. The gate insulating layer and the first and second passivation layers include a first contact hole exposing a part of the gate pad, the first and second passivation layers include a second contact hole exposing a part of the data pad, and at least one of the first and second contact holes have a positive taper structure having a wider area at an upper side than at a lower side.

19 Claims, 35 Drawing Sheets

(56) References Cited

U.S. PATENT DOCUMENTS

| | | | |
|---|---|---|---|
| 7,560,316 B2* | 7/2009 | Heo et al. | 438/149 |
| 7,656,482 B2* | 2/2010 | Kim et al. | 349/114 |
| 7,667,800 B2* | 2/2010 | Park | 349/114 |
| 7,683,375 B2 | 3/2010 | Tanaka | |
| 7,692,740 B2 | 4/2010 | Doi et al. | |
| 7,800,101 B2* | 9/2010 | Song et al. | 257/40 |
| 8,094,280 B2 | 1/2012 | Kim et al. | |
| 8,314,914 B2* | 11/2012 | Ko et al. | 349/142 |
| 8,399,182 B2* | 3/2013 | Lim et al. | 430/316 |
| 8,410,484 B2* | 4/2013 | Park et al. | 257/59 |
| 8,450,737 B2* | 5/2013 | Choi et al. | 257/59 |
| 8,711,302 B2* | 4/2014 | Kim | 349/110 |
| 2004/0246424 A1 | 12/2004 | Sawasaki et al. | |
| 2008/0076204 A1* | 3/2008 | Yoon et al. | 438/99 |
| 2009/0026445 A1* | 1/2009 | Noh et al. | 257/40 |
| 2009/0280591 A1 | 11/2009 | Hong et al. | |
| 2009/0310047 A1* | 12/2009 | Shin et al. | 349/37 |
| 2010/0109007 A1* | 5/2010 | Lee et al. | 257/59 |
| 2010/0157207 A1 | 6/2010 | Lee et al. | |
| 2010/0225842 A1* | 9/2010 | Hur et al. | 349/48 |
| 2011/0109827 A1 | 5/2011 | Oh et al. | |
| 2011/0284853 A1 | 11/2011 | Park et al. | |
| 2011/0297931 A1* | 12/2011 | Yang et al. | 257/43 |
| 2012/0028387 A1* | 2/2012 | Park et al. | 438/23 |
| 2012/0038874 A1* | 2/2012 | Kim et al. | 349/138 |
| 2012/0068200 A1 | 3/2012 | Oh et al. | |
| 2012/0112181 A1* | 5/2012 | Lee et al. | 257/43 |
| 2012/0127148 A1* | 5/2012 | Lee et al. | 345/212 |
| 2012/0200818 A1* | 8/2012 | Lee et al. | 349/143 |
| 2012/0238062 A1* | 9/2012 | Kim et al. | 438/158 |
| 2012/0281173 A1* | 11/2012 | Kwon et al. | 349/123 |
| 2013/0020591 A1 | 1/2013 | Park et al. | |
| 2013/0069069 A1* | 3/2013 | Koo et al. | 257/59 |
| 2013/0075739 A1* | 3/2013 | Loy et al. | 257/60 |
| 2013/0140570 A1* | 6/2013 | Kang et al. | 257/59 |
| 2013/0214299 A1* | 8/2013 | Ryu et al. | 257/88 |

FOREIGN PATENT DOCUMENTS

| | | |
|---|---|---|
| KR | 1020110127919 | 11/2011 |
| KR | 1020110139873 | 12/2011 |
| KR | 1020130011856 | 1/2013 |

\* cited by examiner

THIN FILM TRANSISTOR ARRAY PANEL

CROSS-REFERENCE TO RELATED APPLICATION

This application claims priority under 35 U.S.C. §119 to Korean Patent Application No. 10-2012-0123209, filed on Nov. 1, 2012, the disclosure of which is incorporated by reference herein in its entirety.

TECHNICAL FIELD

Exemplary embodiments of the present invention relate to a thin film transistor array panel and a manufacturing method thereof.

DISCUSSION OF THE RELATED ART

A liquid crystal display includes two display panels on which electric field generating electrodes, such as a pixel electrode and a common electrode, are formed, and a liquid crystal layer interposed between the two display panels. The liquid crystal display generates an electric field in a liquid crystal layer by applying a voltage to the electric field generating electrode, determines a direction of liquid crystal molecules of the liquid crystal layer through the generated electric field, and controls polarization of incident light to display an image.

In the liquid crystal display, the two electric field generating electrodes for generating an electric field in the liquid crystal layer may be formed on the thin film transistor array panel.

When the two electric field generating electrodes are formed on the thin film transistor array panel, a plurality of insulating layers may be disposed between the thin film transistor and the electric field generating electrodes. At least one layer among the plurality of insulating layers may be an organic insulating layer. When contact holes for electrically connecting the thin film transistor and the electric field generating electrodes are formed on the plurality of insulating layers, a width of the contact hole may be increased by a process of etching each insulating layer. When the width of the contact hole is increased, an aperture ratio of the liquid crystal display using the thin film transistor array panel may be decreased.

When a cross-section of the contact hole has a reverse taper structure resulting from the etching of the insulating layer when the contact holes are formed in the plurality of insulating layers, the electric field generating electrode formed on the insulating layer may be disconnected inside the contact hole.

SUMMARY

Exemplary embodiments of the present invention provide a thin film transistor array panel in which two electric field generating electrodes are formed on the thin film transistor array panel, and a width of a contact hole is prevented from being increased, and a manufacturing method thereof.

Exemplary embodiments of the present invention provide a thin film transistor array panel in which a cross-section of a contact hole is formed to have a positive taper structure, and electric field generating electrodes are prevented from being disconnected inside the contact hole, and a manufacturing method thereof.

An exemplary embodiment of the present invention provides a thin film transistor array panel, including a substrate, a plurality of gate lines disposed on the substrate and including a gate pad, a gate insulating layer disposed on the plurality of gate lines, a plurality of data lines disposed on the gate insulating layer and including a source electrode and a data pad, and a drain electrode, a first passivation layer disposed on the plurality of data lines and the drain electrode, a first electric field generating electrode disposed on the first passivation layer, a second passivation layer disposed on the first electric field generating electrode, and a second electric field generating electrode disposed on the second passivation layer. The first passivation layer and the second passivation layer may be inorganic materials, and the gate insulating layer, the first passivation layer, and the second passivation layer may have a first contact hole exposing a part of the gate pad. The first passivation layer and the second passivation layer may have a second contact hole exposing a part of the data pad. One or more of the first contact hole and the second contact hole may have a positive taper structure in which a cross-sectional area becomes widened from a lower side to an upper side.

At least one of the gate insulating layer, the first passivation layer, and the second passivation layer may include a lower layer and an upper layer on the lower layer, and a cross-sectional area of a contact hole of the upper layer may be larger than a cross-sectional area of a contact hole of the lower layer.

The first passivation layer may be a single layer.

The second passivation layer may be a bi-layer including the lower layer and the upper layer disposed on the lower layer.

An etching speed of the first passivation layer may be the same as or slower than that of the lower layer of the second passivation layer, and an etching speed of the lower layer of the second passivation layer may be slower than that of the upper layer of the second passivation layer.

An etching speed of the gate insulating layer may be slower than that of the first passivation layer.

A ratio of a combination concentration of nitrogen and hydrogen to a combination concentration of silicon and hydrogen of the first passivation layer may be about the same or smaller than a ratio of a combination concentration of nitrogen and hydrogen to a combination concentration of silicon and hydrogen of the lower layer of the second passivation layer, and a ratio of a combination concentration of nitrogen and hydrogen to a combination concentration of silicon and hydrogen of the lower layer of the second passivation layer may be smaller than a ratio of a combination concentration of nitrogen and hydrogen to a combination concentration of silicon and hydrogen of the upper layer of the second passivation layer.

The thin film transistor array panel may further include an organic layer disposed between the first passivation layer and the first electric field generating electrode. The organic layer may not be disposed at regions corresponding to the gate pad and the data pad.

The first passivation layer and the second passivation layer may include a drain electrode contact hole exposing a part of the drain electrode, the second electric field generating electrode may be connected with the drain electrode through the drain electrode contact hole, and the drain electrode contact hole may have a positive taper structure in which a cross-sectional area becomes widened from a lower side to an upper side.

The organic layer may have an opening surrounding the drain electrode contact hole.

An exemplary embodiment of the present invention provides a thin film transistor array panel including, a substrate, a plurality of gate lines disposed on the substrate and including a gate pad, a gate insulating layer disposed on the plurality of gate lines, a plurality of data lines disposed on the gate insulating layer and including a source electrode and a data pad, and a drain electrode, a first passivation layer disposed on the plurality of data lines and the drain electrode, a first electric field generating electrode disposed on the first passivation layer, a second passivation layer disposed on the first electric field generating electrode, and a second electric field generating electrode disposed on the second passivation layer. The first passivation layer and the second passivation layer may be inorganic materials, and a ratio of a combination concentration of nitrogen and hydrogen to a combination concentration of silicon and hydrogen within the passivation layer may be larger than a ratio of a combination concentration of nitrogen and hydrogen to a combination concentration of silicon and hydrogen within the second passivation layer.

The second passivation layer may be a bi-layer including a lower layer and an upper layer disposed on the lower layer, a ratio of a combination concentration of nitrogen and hydrogen to a combination concentration of silicon and hydrogen of the first passivation layer may be about the same or smaller than a ratio of a combination concentration of nitrogen and hydrogen to a combination concentration of silicon and hydrogen of the lower layer of the second passivation layer, and a ratio of a combination concentration of nitrogen and hydrogen to a combination concentration of silicon and hydrogen of the lower layer of the second passivation layer may be smaller than a ratio of a combination concentration of nitrogen and hydrogen to a combination concentration of silicon and hydrogen of the upper layer of the second passivation layer.

An exemplary embodiment of the present invention provides a method of manufacturing a thin film transistor array panel including forming a plurality of gate lines including a gate pad on a substrate, forming a gate insulating layer on the plurality of gate lines, forming a semiconductor on the gate insulating layer, forming a plurality of data lines including a source electrode and a data pad, and a drain electrode on the semiconductor, forming a first passivation layer on the plurality of data lines and the drain electrode; forming a first electric field generating electrode on the first passivation layer, forming a second passivation layer on the first electric field generating electrode, and forming a second electric field generating electrode on the second passivation layer. An etching speed of the first passivation layer may be slower than that of the second passivation layer.

The forming of the second passivation layer may include forming a first layer on the first passivation layer, and forming a second layer on the first layer. An etching speed of the second layer may be faster than that of the first layer.

In the forming of the first layer, the first layer may be formed to have an etching speed about the same as or faster than that of the first passivation layer.

In the forming of the gate insulating layer, the gate insulating layer may be formed to have an etching speed slower than that of the first passivation layer.

The method of manufacturing the thin film transistor array panel may further include forming a contact hole by etching the second passivation layer and the third passivation layer, and in the forming of the contact hole, the contact hole may be formed to have a positive taper structure in which a cross-sectional area becomes widened from a lower side to an upper side.

The method of manufacturing the thin film transistor array panel may further include forming an organic insulating layer between the first passivation layer and the second passivation layer, and in the forming of the organic insulating layer, the organic insulating layer may not be formed around the contact hole.

The method of manufacturing the thin film transistor array panel may further include forming an organic insulating layer between the first passivation layer and the second passivation layer, and the organic insulating layer may not be formed at regions corresponding to the gate pad and the data pad.

The method of manufacturing the thin film transistor array panel may further include forming a first contact hole exposing a part of the gate pad in the gate insulating layer, the first passivation layer, and the second passivation layer.

In the forming of the first contact hole, the first contact hole may be formed to have a positive taper structure in which a cross-sectional area becomes widened from a lower side to an upper side.

The method of manufacturing the thin film transistor array panel may further include forming a second contact hole exposing a part of the data pad in the first passivation layer and the second passivation layer.

In the forming of the second contact hole, the second contact hole may be formed to have a positive taper structure in which a cross-sectional area becomes widened from a lower side to an upper side.

The first passivation layer may be formed at a temperature higher than that of the second passivation layer.

The forming of the second passivation layer may include forming a first layer on the first passivation layer, and forming a second layer on the first layer. The first layer may be formed at a temperature higher than that of the second layer.

The gate insulating layer may be formed at a temperature about the same as or higher than that of the first passivation layer.

In the method of manufacturing the thin film transistor array panel, a ratio of a combination concentration of nitrogen and hydrogen to a combination concentration of silicon and hydrogen within the first passivation layer may be formed to be about the same as or smaller than a ratio of a combination concentration of nitrogen and hydrogen to a combination concentration of silicon and hydrogen within the second passivation layer.

The forming of the second passivation layer may include forming a first layer on the first passivation layer and forming a second layer on the first layer, and in the method of manufacturing the thin film transistor array panel, a ratio of a combination concentration of nitrogen and hydrogen to a combination concentration of silicon and hydrogen of the first passivation layer may be formed to be about the same as or smaller than a ratio of a combination concentration of nitrogen and hydrogen to a combination concentration of silicon and hydrogen of the first layer of the second passivation layer, and a ratio of a combination concentration of nitrogen and hydrogen to a combination concentration of silicon and hydrogen of the first layer of the second passivation layer may be formed to be smaller than a ratio of a combination concentration of nitrogen and hydrogen to a combination concentration of silicon and hydrogen of the second layer of the second passivation layer.

An exemplary embodiment of the present invention provides a thin film transistor array panel, including a substrate, a plurality of gate lines disposed on the substrate, wherein each gate line includes a gate pad, a gate insulating layer disposed on the plurality of gate lines, a plurality of data lines disposed on the gate insulating layer, wherein each data line includes a data pad connected to a source electrode and a drain electrode, a first passivation layer disposed on the plurality of data lines and the drain electrode, a first electric field generating electrode disposed on the first passivation layer, a second passivation layer disposed on the first electric field generating electrode, and a second electric field generating electrode disposed on the second passivation layer. The gate insulating layer, the first passivation layer, and the second passivation layer include a first contact hole exposing a part of the gate pad, the first passivation layer and the second passivation layer include a second contact hole exposing a part of the data pad, and at least one of the first contact hole and the second contact hole have a positive taper structure having a wider area at an upper side than at a lower side.

An exemplary embodiment of the present invention provides a thin film transistor array panel, including a substrate, a plurality of gate lines disposed on the substrate, wherein each gate line includes a gate pad, a gate insulating layer disposed on the plurality of gate lines, a plurality of data lines disposed on the gate insulating layer, wherein each data line includes a data pad connected to a source electrode and a drain electrode, a first passivation layer disposed on the plurality of data lines and the drain electrode, a first electric field generating electrode disposed on the first passivation layer, a second passivation layer disposed on the first electric field generating electrode, and a second electric field generating electrode disposed on the second passivation layer. A ratio of a combination concentration of nitrogen and hydrogen to a combination concentration of silicon and hydrogen of the first passivation layer is larger than a ratio of a combination concentration of nitrogen and hydrogen to a combination concentration of silicon and hydrogen of the second passivation layer.

An exemplary embodiment of the present invention provides a method of manufacturing a thin film transistor array panel, including forming a plurality of gate lines on a substrate, wherein each gate line includes a gate pad, forming a gate insulating layer on the plurality of gate lines, forming a semiconductor on the gate insulating layer, forming a plurality of data lines on the semiconductor, wherein each data line includes a data pad connected to a source electrode and a drain electrode, forming a first passivation layer on the plurality of data lines and the drain electrode, forming a first electric field generating electrode on the first passivation layer, forming a second passivation layer on the first electric field generating electrode, and forming a second electric field generating electrode on the second passivation layer. An etching speed of the first passivation layer is slower than an etching speed of the second passivation layer.

An exemplary embodiment of the present invention provides a method of manufacturing a thin film transistor array panel, including forming a plurality of gate lines on a substrate, wherein each gate line includes a gate pad, forming a gate insulating layer on the plurality of gate lines, forming a semiconductor on the gate insulating layer, forming a plurality of data lines on the semiconductor, wherein each data line includes a data pad connected to a source electrode and a drain electrode, forming a first passivation layer on the plurality of data lines and the drain electrode, forming a first electric field generating electrode on the first passivation layer, forming a second passivation layer on the first electric field generating electrode, forming a second electric field generating electrode on the second passivation layer, forming a first contact hole in the gate insulating layer, the first passivation layer, and the second passivation layer, wherein the first contact hole exposes a part of the gate pad, and forming a second contact hole in the first passivation layer and the second passivation layer, wherein the second contact hole exposes a part of the data pad. At least one of the first contact hole and the second contact hole have a positive taper structure having a wider area at an upper side than at a lower side.

The thin film transistor array panel according to exemplary embodiments of the present invention may be formed to have an increasing dry etching speed from the gate insulating layer, to the first passivation layer, to the lower layer of the second passivation layer, and to the upper layer of the second passivation layer in which the contact holes are formed. As a result, the thickness of the insulating layer in which the contact hole is formed may not be large, and a width of the contact hole may be prevented from being increased.

The thin film transistor array panel according to exemplary embodiments of the present invention may be formed so that a cross-section of the contact hole has a positive taper structure.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
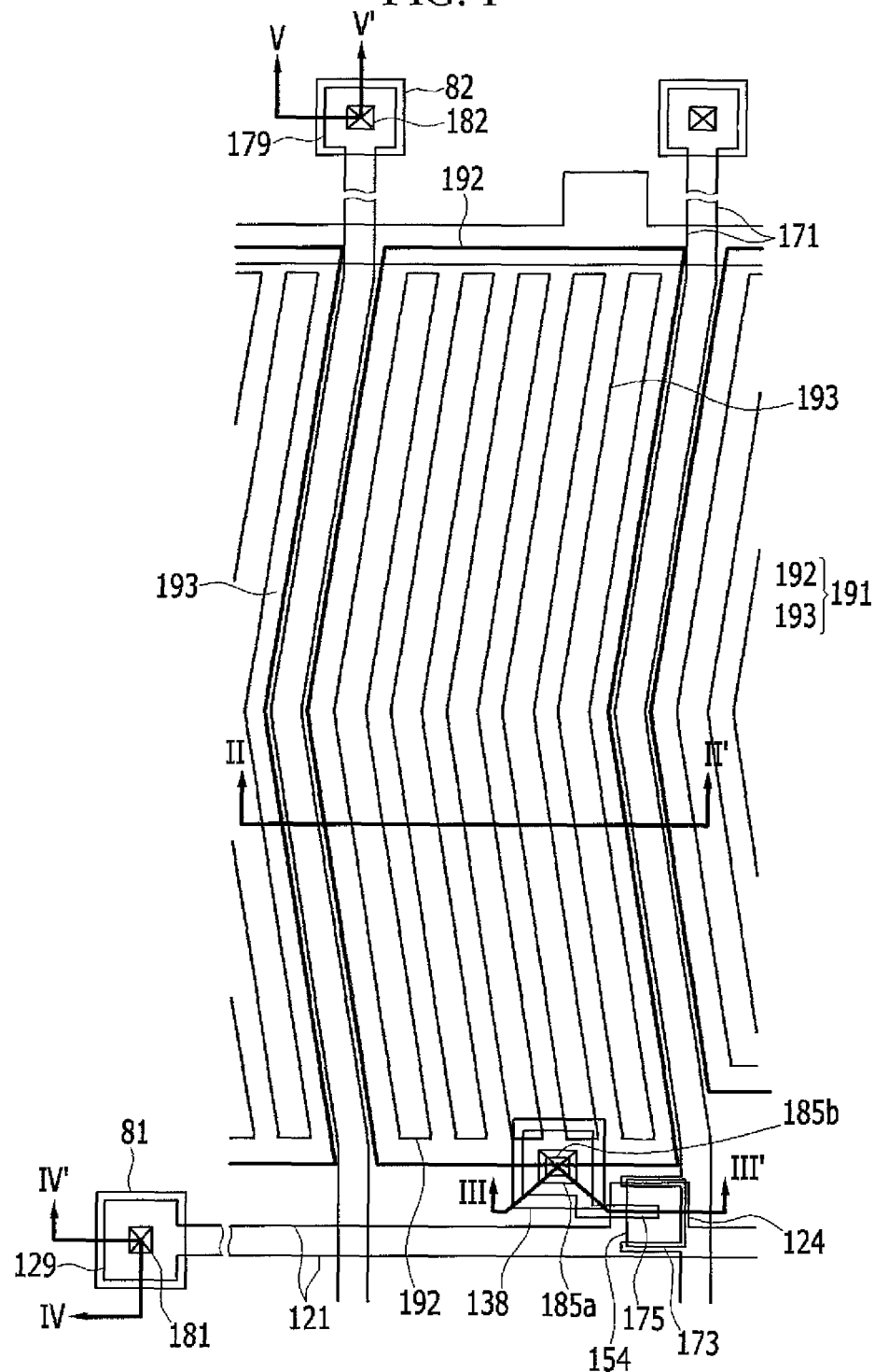
FIG. 1 is a layout view of a thin film transistor array panel, according to an exemplary embodiment of the present invention.

Exemplary embodiments of the present invention will be described more fully hereinafter with reference to the accompanying drawings. Like reference numerals may refer to like elements throughout the accompanying drawings.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Referring to FIGS. 1 to 6, a thin film transistor array panel will be described according to an exemplary embodiment of the present invention.

Figure 2:
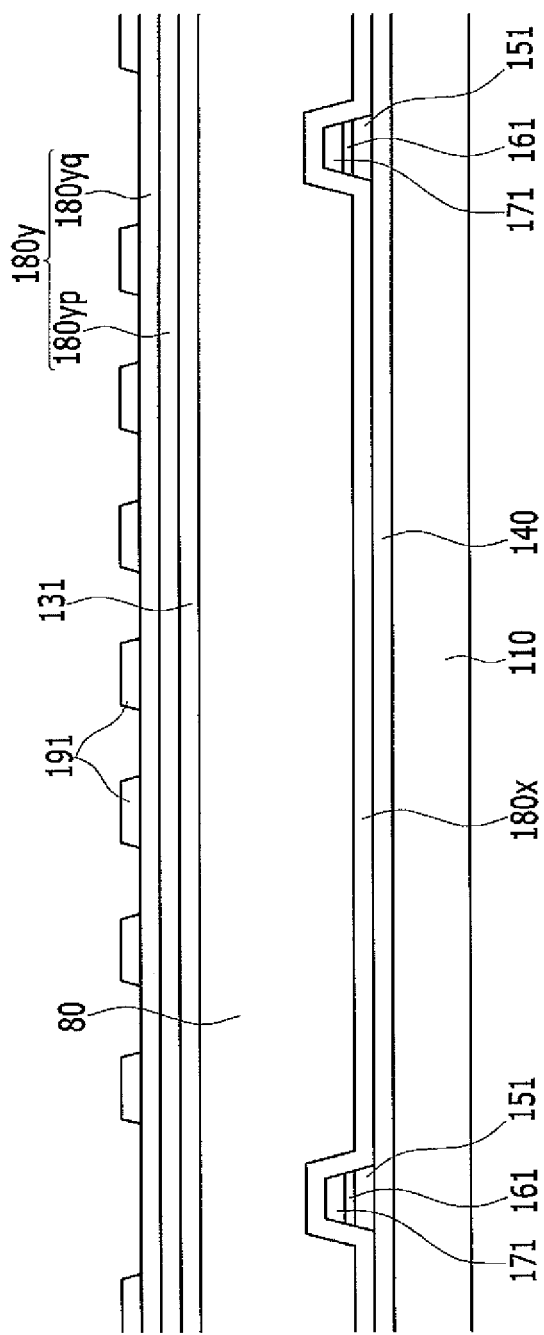
FIG. 2 is a cross-sectional view illustrating the thin film transistor array panel of FIG. 1 taken along line II-II', according to an exemplary embodiment of the present invention.
Figure 3:
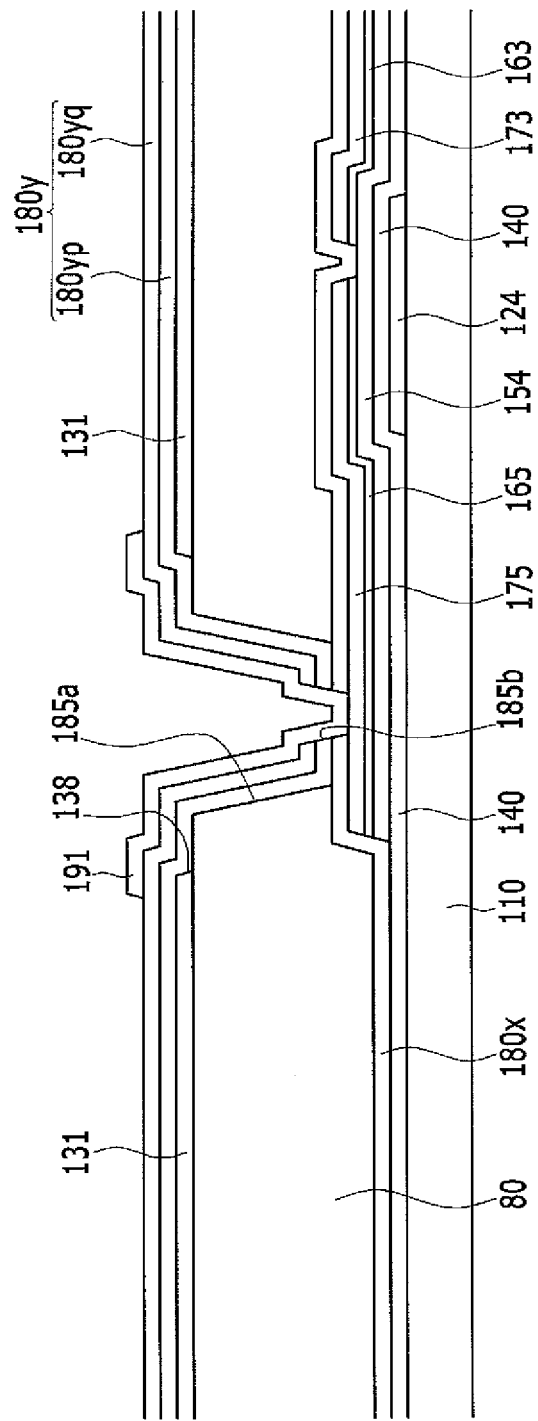
FIG. 3 is a cross-sectional view illustrating the thin film transistor array panel of FIG. 1 taken along line III-III', according to an exemplary embodiment of the present invention.
Figure 4:
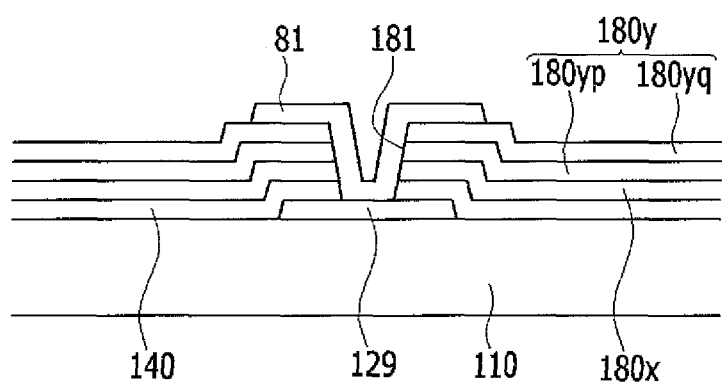
FIG. 4 is a cross-sectional view illustrating the thin film transistor array panel of FIG. 1 taken along line IV-IV', according to an exemplary embodiment of the present invention.
Figure 5:
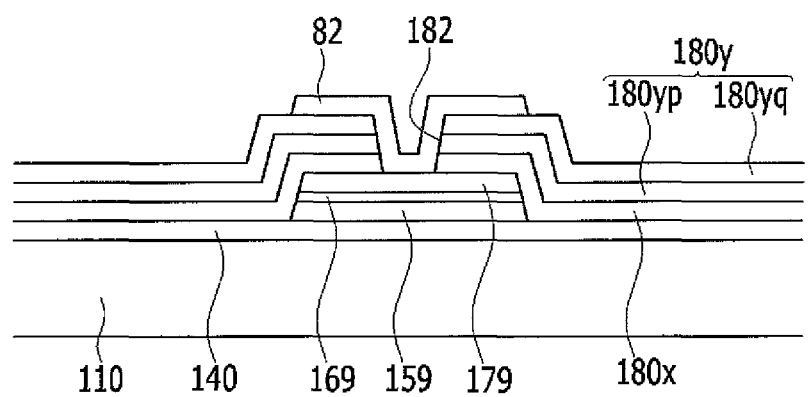
FIG. 5 is a cross-sectional view illustrating the thin film transistor array panel of FIG. 1 taken along line V-V', according to an exemplary embodiment of the present invention.
Figure 6:
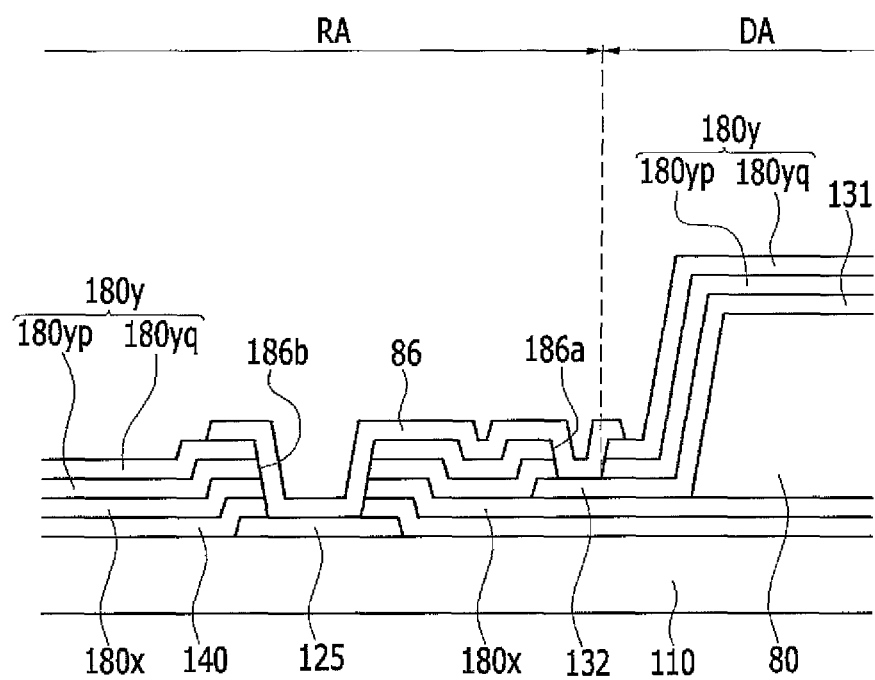
FIG. 6 is a cross-sectional view illustrating a portion of the thin film transistor array panel, according to an exemplary embodiment of the present invention.
Figure 7:
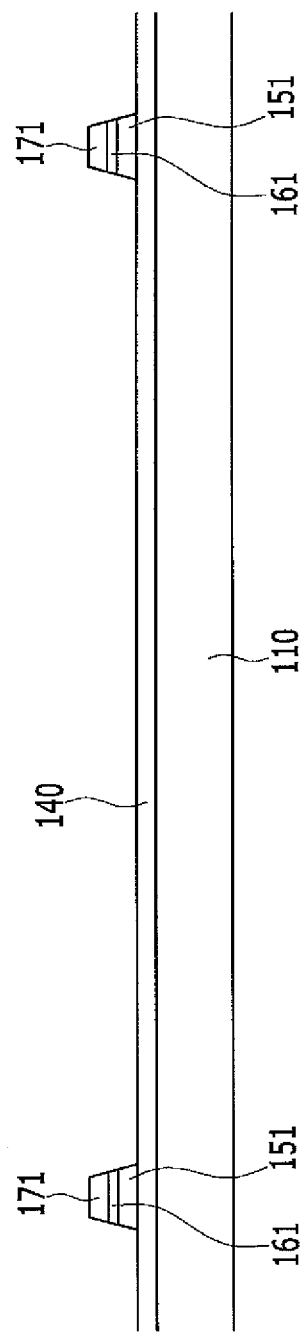
FIGS. 7 to 30 are cross-sectional views illustrating a method of manufacturing a thin film transistor array panel, according to an exemplary embodiment of the present invention.
Figure 8:
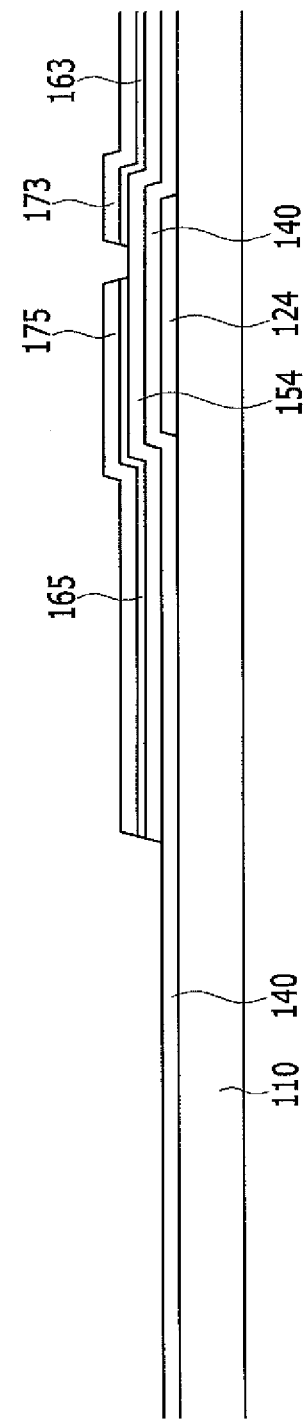
Figure 9:
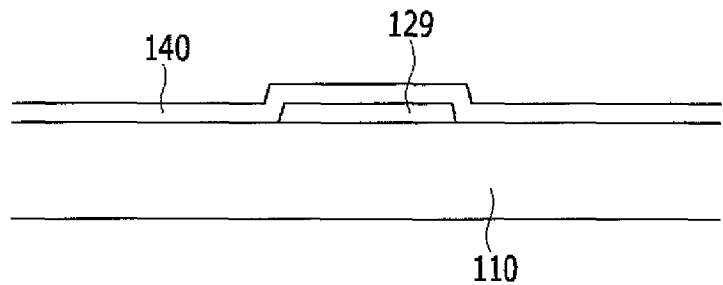
Figure 10:
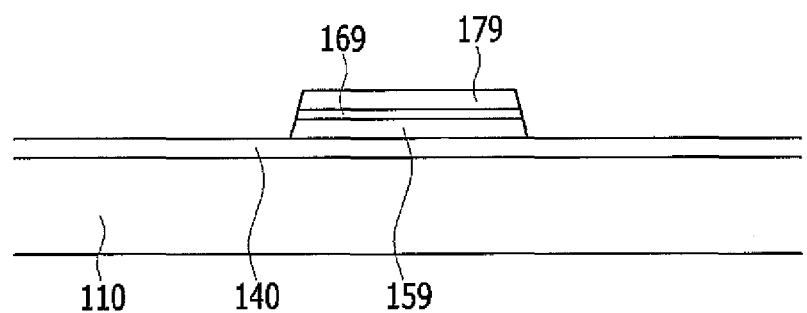
Figure 11:
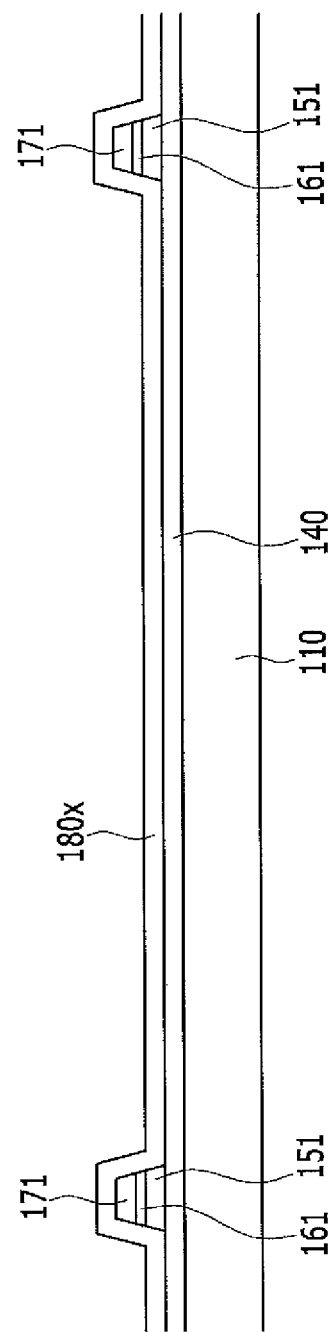
Figure 12:
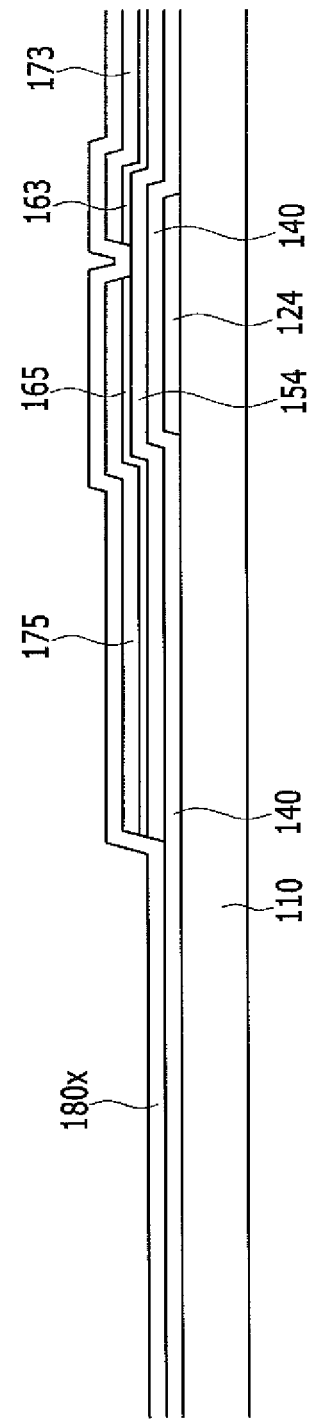
Figure 13:
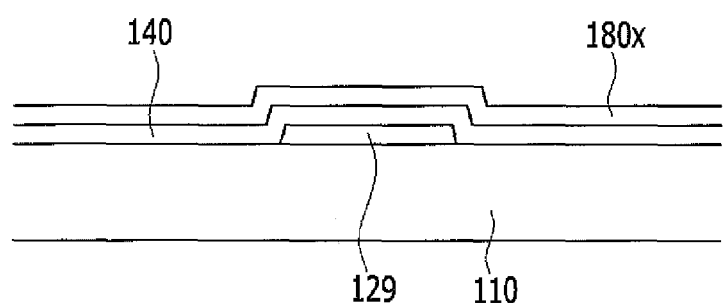
Figure 14:
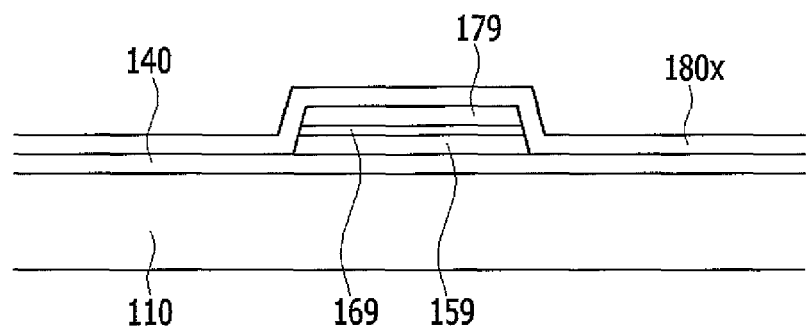
Figure 15:
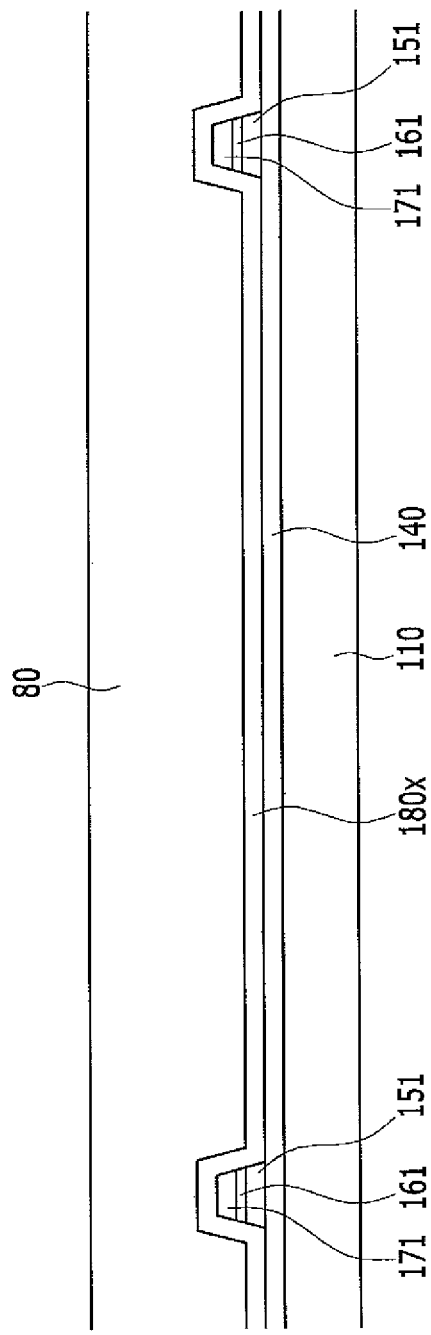
Figure 16:
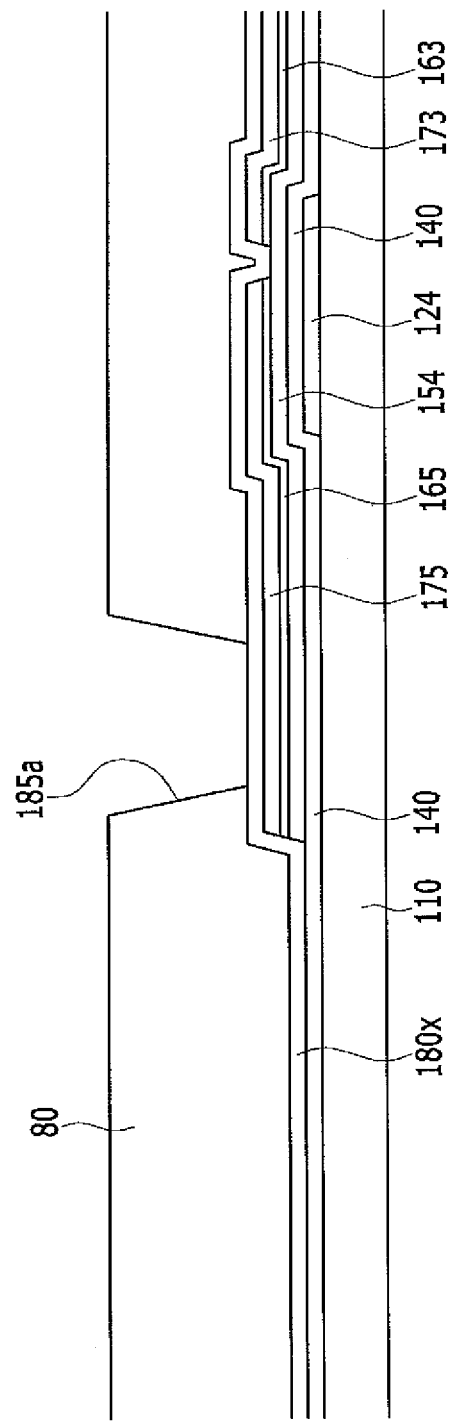
Figure 17:
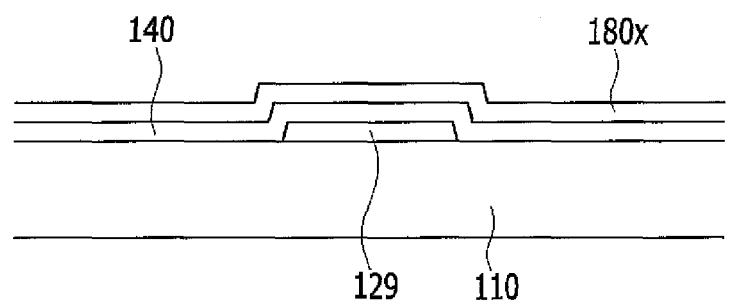
Figure 18:
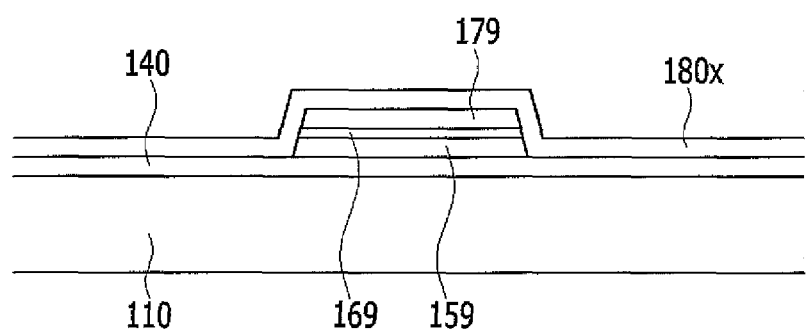
Figure 19:
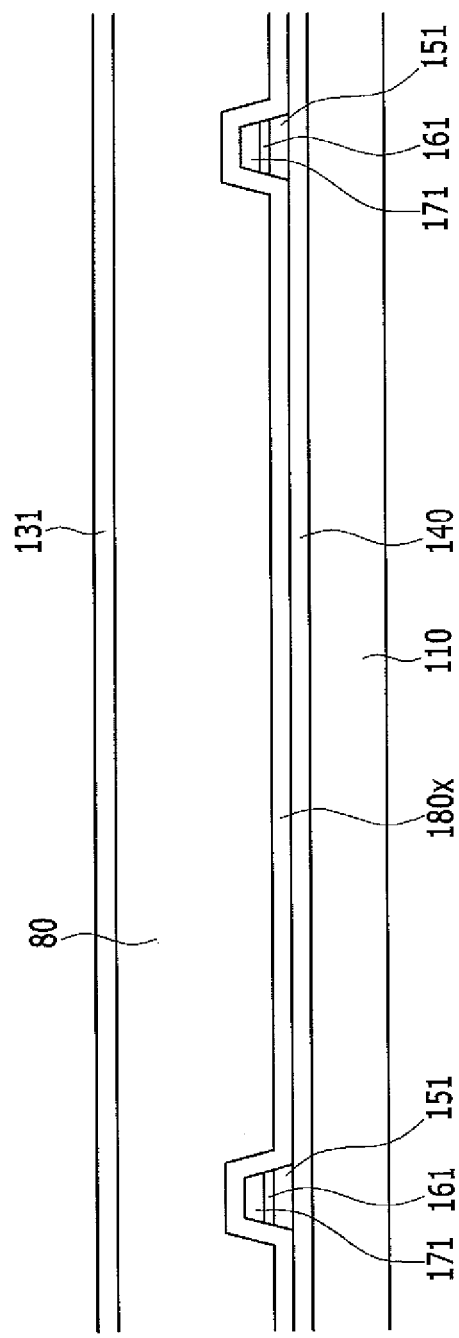
Figure 20:
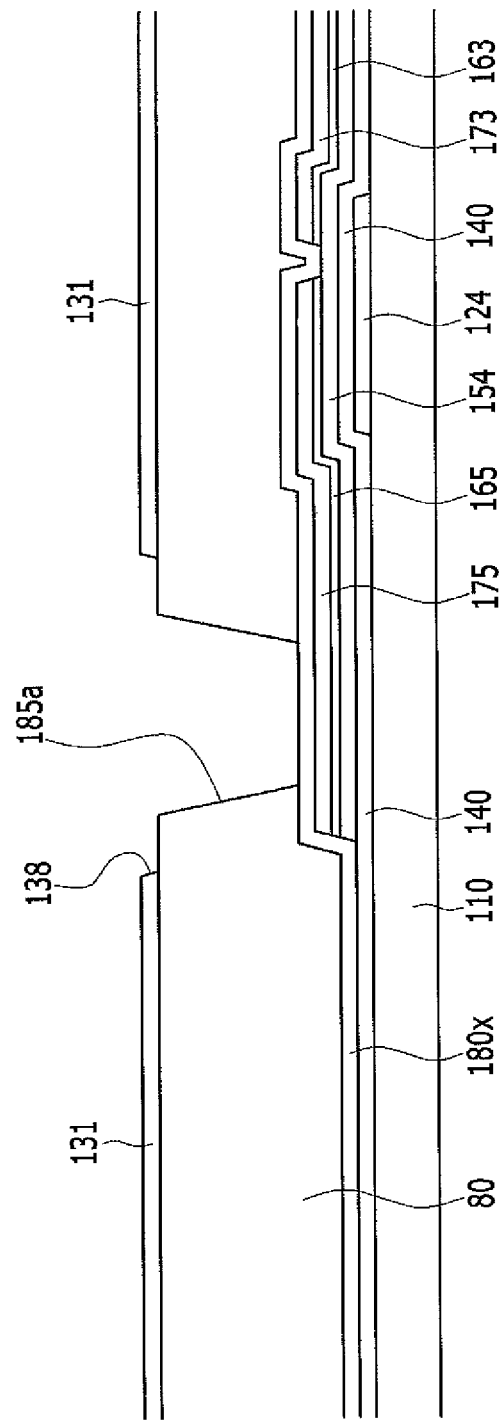
Figure 21:
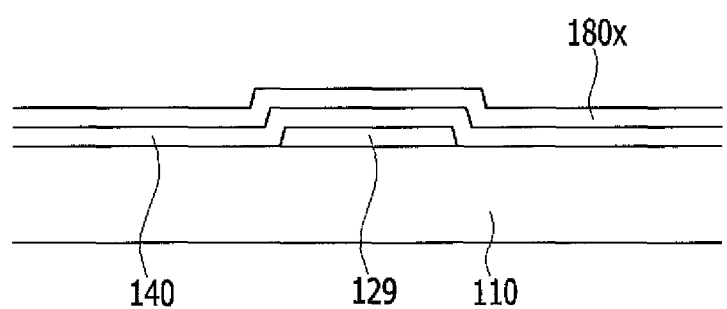
Figure 22:
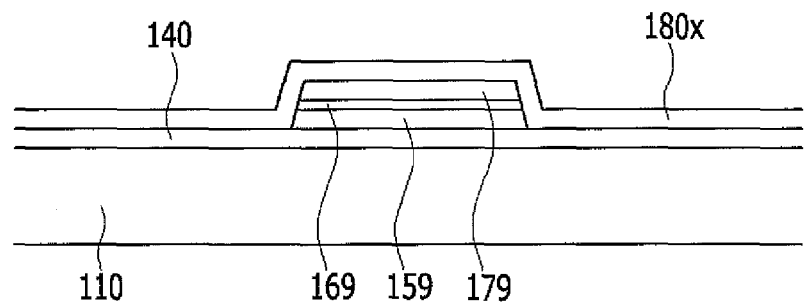
Figure 23:
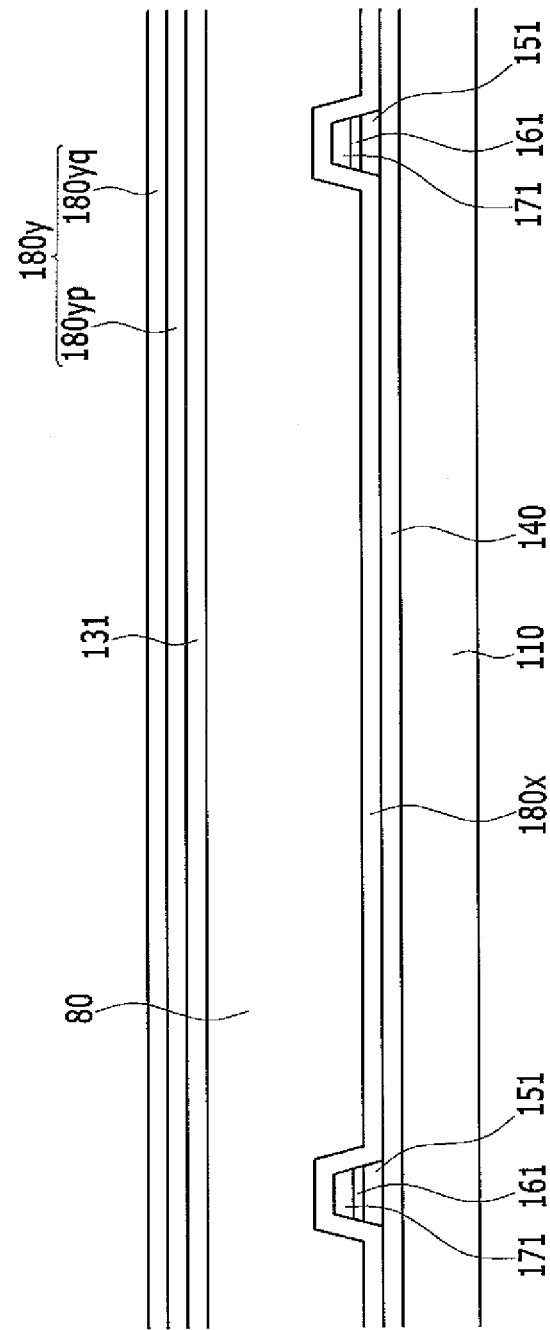
Figure 24:
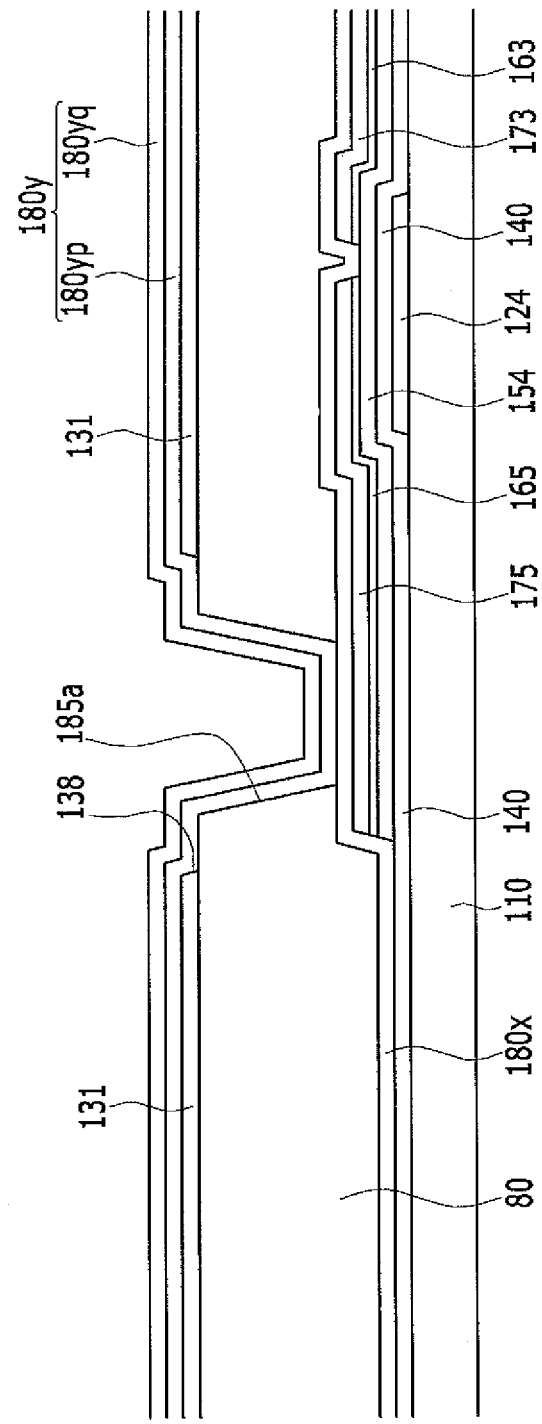
Figure 25:
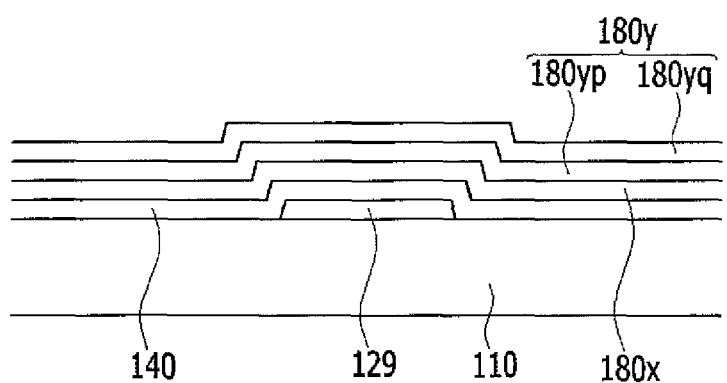
Figure 26:
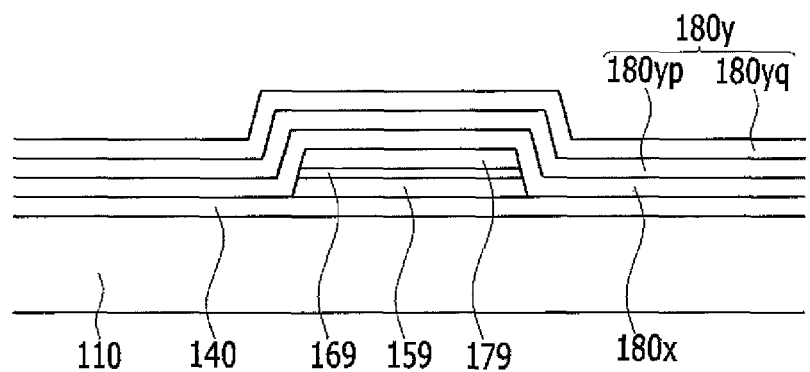
Figure 27:
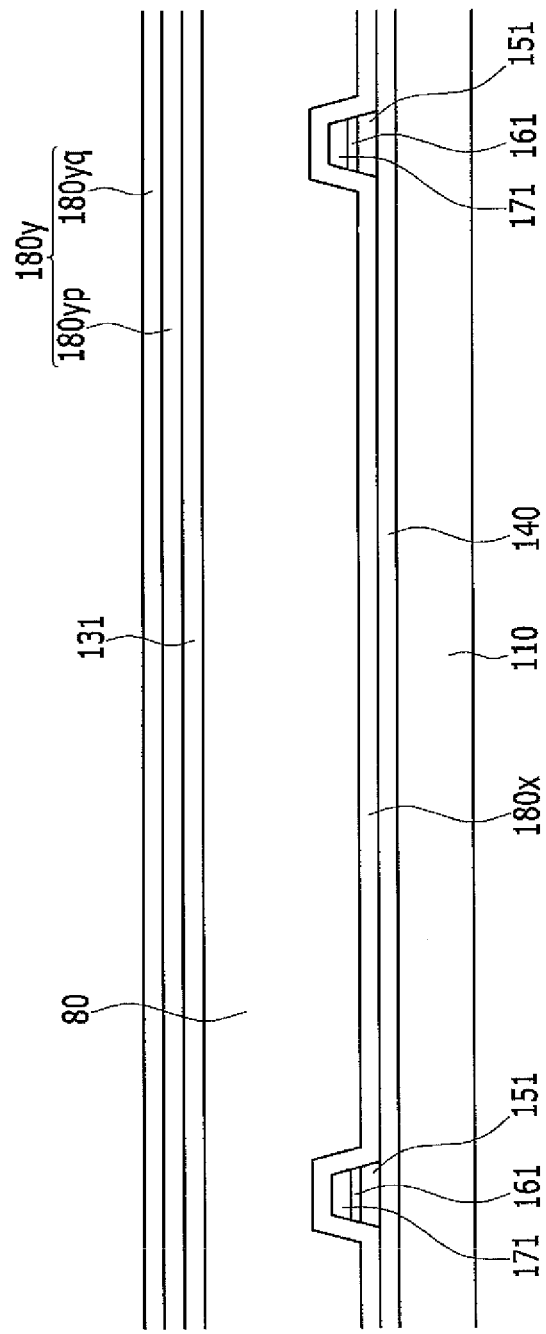
Figure 28:
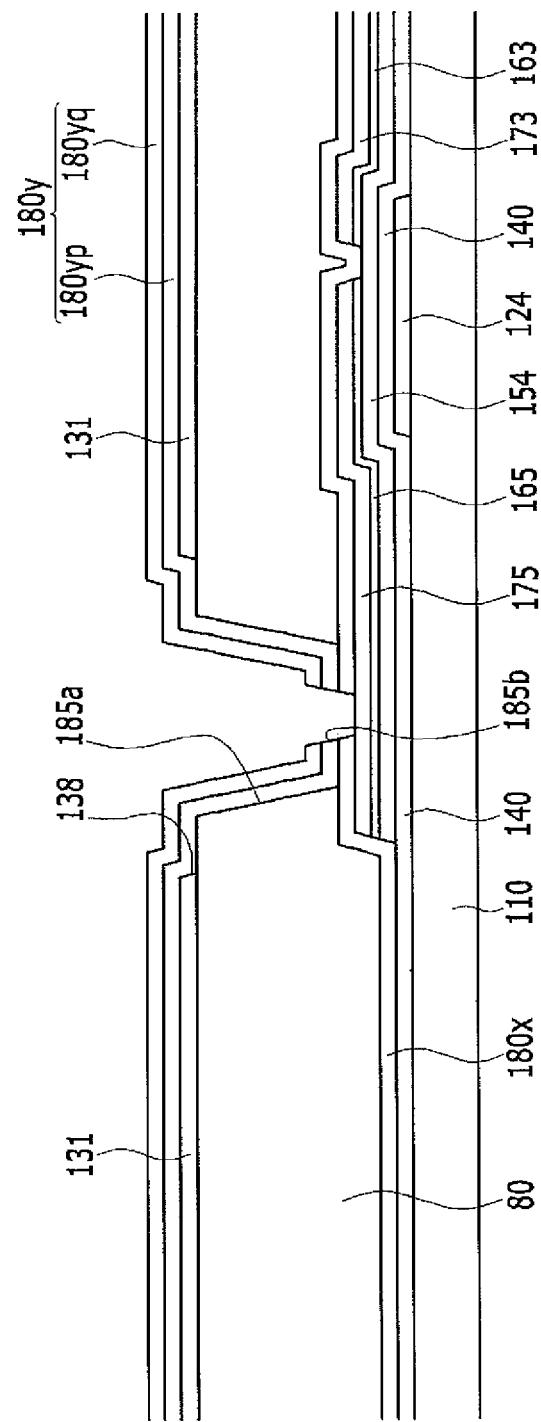
Figure 29:
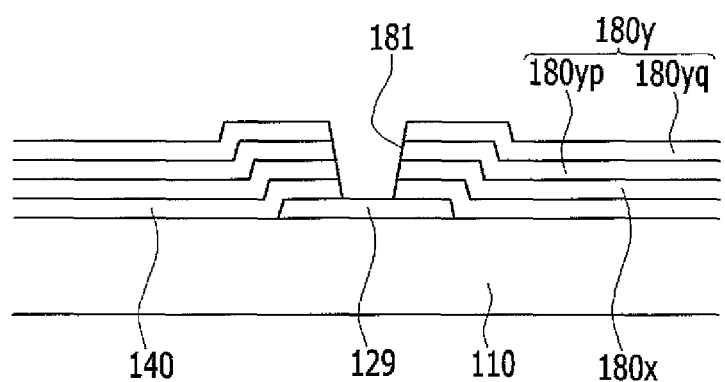
Figure 30:
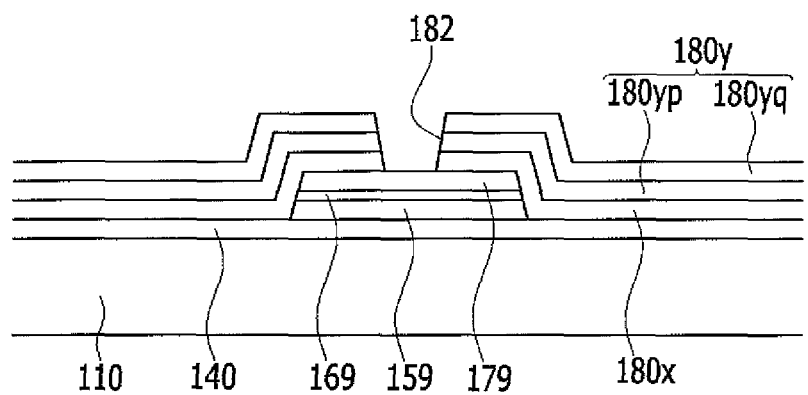

FIG. 1 is a layout view of a thin film transistor array panel, according to an exemplary embodiment of the present invention. FIG. 2 is a cross-sectional view illustrating the thin film transistor array panel of FIG. 1 taken along line II-II', according to an exemplary embodiment of the present invention. FIG. 3 is a cross-sectional view illustrating the thin film transistor array panel of FIG. 1 taken along line III-III', according to an exemplary embodiment of the present invention. FIG. 4 is a cross-sectional view illustrating the thin film transistor array panel of FIG. 1 taken along line IV-IV', according to an exemplary embodiment of the present invention. FIG. 5 is a cross-sectional view illustrating the thin film transistor array panel of FIG. 1 taken along line V-V', according to an exemplary embodiment of the present invention. FIG. 6 is a cross-sectional view illustrating a portion of the thin film transistor array panel, according to an exemplary embodiment of the present invention.

Referring to FIGS. 1 to 6, a plurality of gate lines 121 is formed on an insulating substrate 110.

Each gate line 121 includes a gate pad 129 having a wider area than the gate line 121 for connecting a plurality of gate electrodes 124 protruding downwardly with another layer or an external driving circuit. A gate driving circuit that generates a gate signal may be mounted on a flexible printed circuit film attached to the substrate 110. Alternatively, the gate driving circuit may be directly mounted on the substrate 110.

The gate line 121 may be, for example, a single layer or a multilayer. The multilayer may include, for example, two or more conductive layers.

A gate insulating layer 140 may be formed on the gate line 121. The gate insulating layer 140 may be made of an inorganic insulating material such as, for example, silicon nitride (SiNx) or silicon oxide (SiOx).

A plurality of semiconductors 151 may be formed on the gate insulating layer 140. Each of the semiconductors 151 includes a protrusion 154 extending toward the gate electrode 124. Each of the semiconductors 151 may be, for example, amorphous silicon, poly silicon, an oxide semiconductor, etc. The plurality of semiconductors 151 may include semiconductors of the same type or of different types. According to an exemplary embodiment of the present invention, the semiconductors 151 may be disposed only on the gate electrode 124.

Each of the semiconductors 151 may include an end portion 159 disposed under a data pad 179, as shown in FIG. 5.

A plurality of ohmic contact members 161, 163, 165, and 169 may be formed on the semiconductors 151. The ohmic contact members 163 and 165 form a pair based on the gate electrode 124, and are disposed on the protrusion 154 of the semiconductors 151. The ohmic contact member 169 may be disposed under the data pad 179, as shown in FIG. 5.

The ohmic contact members 161, 163, 165, and 169 may be formed of a material such as, for example, n+ hydrogenated amorphous silicon in which n-type impurities, such as phosphorous, is doped with a high density. The ohmic contact member 161, 163, 165, and 169 may also be formed of silicide. In an exemplary embodiment, the ohmic contact members 161, 163, 165, and 169 may be omitted. For example, when a semiconductor 151 is an oxide semiconductor, the ohmic contact members 161, 163, 165, and 169 may be omitted.

A data conductor including a plurality of data lines 171 and a plurality of drain electrodes 175 may be formed on the ohmic contact members 161, 163, 165, and 169.

The data lines 171 transmit a data signal, and extend substantially in a vertical direction, crossing the gate lines 121. Each data line 171 includes a data pad 179 having a wide area for connecting a plurality of source electrodes 173 extending toward the gate electrode 124 with another layer or the external driving circuit. A data driving circuit that generates the data signal may be mounted on a flexible printed circuit film attached to the substrate 110. Alternatively, the data driving circuit may be directly mounted on the substrate 110.

As shown in FIG. 1, the data line 171 is bent at different portions, and has an oblique angle with respect to an extending direction of the gate line 121. An oblique angle of the data line 171 with respect to the extending direction of the gate line 121 may be, for example, about 45 degrees or more. Alternatively, in an exemplary embodiment, the data line 171 may be substantially straight.

The drain electrode 175 may include a rod-shaped end portion facing the source electrode 173, and another end portion having a wider area.

The data conductors 171 and 175 may be, for example, single layers or multilayers. The multilayers may include, for example, two or more conductive layers.

The gate electrode 124, the source electrode 173, and the drain electrode 175 form a thin film transistor functioning as a switching element together with the protrusion 154 of the semiconductor 151. In an exemplary embodiment, the semiconductor 151 may be formed on substantially the same plane as the data line 171, the drain electrode 175, and the ohmic contact members 161 and 165 thereunder, except for the protrusion 154 of the semiconductor 151 on which the thin film transistor is disposed.

A first passivation layer 180x may be formed on the data lines 171, the drain electrodes 175, and the exposed protrusion 154 of the semiconductor 151. The first passivation layer 180x may be formed of an inorganic insulating layer such as, for example, nitride silicon (SiNx) or silicon oxide (SiOx).

During manufacture, the first passivation layer 180x may be formed at a lower temperature than that of the gate insulating layer 140. Further, an etching speed of the first passivation layer 180x may be faster than that of the gate insulating layer 140.

An organic insulating layer 80 is disposed on a part of the first passivation layer 180x. A surface of the organic insulating layer 80 may be generally flat.

The organic insulating layer 80 may include a first opening 185a, as shown in FIG. 3.

The organic insulating layer 80 may be removed from a region corresponding to the gate pad 129 and the data pad 179. Accordingly, the organic insulating layer 80 may not be disposed in regions in which a first contact hole 181 and a second contact hole 182 exposing the gate pad 129 and the data pad 179 are formed.

Further, the first opening 185a of the organic insulating layer 80 is formed so as to expose a region in which a third contact hole 185b is formed. The third contact hole 185b physically and electrically connects the drain electrode 175 and a pixel electrode 191. Accordingly, the organic insulating layer 80 is not disposed in the region at which the third contact hole 185b is formed.

Accordingly, the organic insulating layer 80 is not disposed in the regions at which the contact holes 181, 182, and 185b are formed, so that the contact holes may not be formed in the organic insulating layer 80 having a large thickness. As a result, during manufacture, an etching time may be reduced by decreasing the thickness of the insulating layer in which the contact holes 181, 182, and 185b are formed, and the contact holes 181, 182, and 185b may be prevented from being widened.

In an exemplary embodiment, the organic insulating layer 80 may be a color filter, and the thin film transistor array panel may further include at least one additional layer disposed on the organic insulating layer 80. For example, the thin film transistor array panel may further include a capping layer disposed on the color filter. The capping layer may prevent pigment of the color filter from flowing into a liquid crystal layer. The capping layer may be formed of an insulating material such as, for example, nitride silicon (SiNx).

A first field generating electrode 131 may be formed on the organic insulating layer 80. The first field generating electrode 131 may be formed of a transparent conductive material such as, for example, indium tin oxide (ITO) or indium zinc oxide (IZO). In an exemplary embodiment, the first field generating electrode 131 may have a plate shape.

The first electric field generating electrode 131 is connected with a common voltage line 125, which is disposed at a peripheral area around a display area, through a plurality of fourth contact holes 186a and a plurality of fifth contact holes 186b, as shown in FIG. 6. The first electric field generating electrode 131 receives a common voltage through the fourth contact holes 186a and fifth contact holes 186b.

The first electric field generating electrode 131 may include a second opening 138 formed in a region corresponding to the drain electrode 175.

A second passivation layer 180y is formed on the first electric field generating electrode 131 and a part of the first passivation layer 180x. The second passivation layer 180y may be formed of an inorganic insulating material such as, for example, silicon nitride SiNx or silicon oxide SiOx. The second passivation layer 180y may include a first layer 180yp and a second layer 180yq disposed on the first layer 180yp. An etching speed of the second layer 180yq may be faster than that of the first layer 180yp. The first layer 180yp may be formed at a temperature that is about the same as or lower than that of the first passivation layer 180x. Further, a ratio of nitrogen within the second passivation layer 180y may be higher than that of nitrogen within the first passivation layer 180x. For example, when the first passivation layer 180x and the second passivation layer 180y include nitride silicon, a ratio of the number of combinations [N—H] of nitrogen and hydrogen to the number of combinations [Si—H] of silicon and hydrogen within the second passivation layer 180y (e.g., a value of [N—H]/[Si—H]), may be larger than a ratio of the number of combinations [N—H] of nitrogen and hydrogen to the number of combinations [Si—H] of silicon and hydrogen within the first passivation layer 180x (e.g., a value of [N—H]/[Si—H]). The value of [N—H]/[Si—H] within the first passivation layer 180x and the second passivation layer 180y may be obtained using an FT-IR spectrometer. Further, the value of [N—H]/[Si—H], that is, the ratio of the number of combinations [N—H] of nitrogen and hydrogen to the number of combinations [Si—H] of silicon and hydrogen within the first layer 180yp, may be about the same as or larger than the value of [N—H]/[Si—H] of the first passivation layer 180x, and the value of [N—H]/[Si—H] within the second layer 180yq may be larger than the value of [N—H]/[Si—H] of the first layer 180yp.

A second electric field generating electrode 191 may be formed on the second passivation layer 180y. The second field generating electrode 191 may be formed of a transparent conductive material such as, for example, ITO or IZO.

The second electric field generating electrode 191 may include a plurality of branch electrodes 193 extending substantially parallel to each other and spaced apart from each other, and upper and lower horizontal parts 192 that connect upper and lower ends of the branch electrodes 193. The branch electrodes 193 may be bent along the data lines 171, as shown in FIG. 1. Alternatively, in an exemplary embodiment, the data lines 171 and the branch electrodes 193 may extend in a substantially straight line.

The first contact hole 181 exposing a part of the gate pad 129 is formed in the first passivation layer 180x, the second passivation layer 180y, and the gate insulating layer 140. The number of first contact holes 181 may be at least one, and a plane shape of the first contact hole 181 may be a polygon such as, for example, a quadrangle, a circular shape, or an elliptical shape. A first connecting member 81 is formed at the first contact hole 181. The first connecting member 81 is formed on the same layer together with the second electric field generating electrode 191.

As described above, the organic insulating layer 80 is not disposed in the region in which the gate pad 129 is disposed. Accordingly, the first contact hole 181 exposing the gate pad 129 is not formed in the organic insulating layer 80, and is instead formed in the gate insulating layer 140, the first passivation layer 180x, and the second passivation layer 180y, which have a relatively thin thickness compared to the thickness of the organic insulating layer 80. Accordingly, during manufacture, the etching time may be decreased when the first contact hole 181 is formed, and a cross-sectional area of the first contact hole 181 may be prevented from being widened due to an increased etching time.

As described above, during manufacture, the gate insulating layer 140 may be formed at a temperature higher than that of the first passivation layer 180x, and may have an etching speed slower than that of the first passivation layer 180x. Further, the first layer 180yp of the second passivation layer 180y may be formed at a temperature about the same as or lower than that of the first passivation layer 180x, and may have an etching speed about the same as or faster than that of the first passivation layer 180x. Further, the second layer 180yq of the second passivation layer 180y may be formed at a temperature lower than that of the first layer 180yp of the second passivation layer 180y, and may have an etching speed faster than that of the second layer 180yq.

That is, the etching speed may be increased as the etching process advances from the gate insulating layer 140, to the first passivation layer 180x, to the first layer 180yp of the second passivation layer 180y, to the second layer 180yq of the second passivation layer 180y. For example, the gate insulating layer 140 in which the first contact hole 181 is formed, the first passivation layer 180x, the first layer 180yp of the second passivation layer 180y, and the second layer 180yq of the second passivation layer 180y have increased etching speeds near an upper side. Accordingly, the first contact hole 181 is formed to have a positive taper structure. For example, when the first contact hole 181 has a positive taper structure, a cross-sectional area of the first contact hole 181 widens from a lower side of the first contact hole 181 that contacts the gate pad 129 to an upper side of the first contact hole 181, as shown in FIG. 4.

Further, the values of [N—H]/[Si—H] of the first passivation layer 180x, the first layer 180yp of the second passivation layer 180y, and the second layer 180yq of the second passivation layer 180y increase toward the upper side.

The second contact hole 182 exposing a part of the data pad 179 is formed in the first passivation layer 180x and the second passivation layer 180y. The number of second contact holes 182 may be at least one, and a plane shape of the second contact hole 182 may be a polygon such as, for example, a quadrangle, or a circular shape or an elliptical shape. A second connecting member 82 is formed at the second contact hole 182. The second connecting member 82 may be formed on the same layer together with the second electric field generating electrode 191, as shown in FIG. 5.

Further, a third contact hole 185b exposing part of the drain electrode 175 is formed in the first passivation layer 180x and the second passivation layer 180y. The third contact hole 185b is formed inside a region surrounded by the first opening 185a of the organic insulating layer 80 and the second opening 138 of the first electric field generating electrode 131.

As described above, the organic insulating layer 80 is not disposed in the region in which the data pad 179 is disposed. Accordingly, the second contact hole 182 exposing the data pad 179 is not formed in the organic insulating layer 80, and is rather formed in the first passivation layer 180x and the second passivation layer 180y, which have a relatively thin thickness compared to the thickness of the organic insulating layer 80. Accordingly, during manufacture, the etching time may be decreased when the second contact hole 182 is formed. As a result, a cross-sectional area of the second contact hole 182 may be prevented from being widened due to the increased etching time.

Similarly, the third contact hole 185b exposing the drain electrode 175 is formed in a region surrounded by the first opening 185a of the organic insulating layer 80. Accordingly, the third contact hole 185b exposing the drain electrode 175 is not formed in the organic insulating layer 80, and is rather formed in the first passivation layer 180x and the second passivation layer 180y, which have a relatively thin thickness compared to the thickness of the organic insulating layer 80. Accordingly, during manufacture, the etching time may be decreased when the second contact hole 182 is formed. As a result, a cross-sectional area of the second contact hole 182 may be prevented from being widened due to the increased etching time.

As described above, the first layer 180yp of the second passivation layer 180y may be formed at a temperature about the same as or lower than that of the first passivation layer 180x, and may have an etching speed about the same as or faster than that of the first passivation layer 180x. Further, the second layer 180yq of the second passivation layer 180y may be formed at a temperature about the same as or lower than that of the first layer 180yp of the second passivation layer 180y, and may have an etching speed faster than that of the second layer 180yq. Further, the first passivation layer 180x may be formed as a single layer with an etching speed about the same as or slower than that of the first layer 180yp of the second passivation layer 180y.

That is, the etching speed may be increased as the etching process proceeds from the first passivation layer 180x, to the first layer 180yp of the second passivation layer 180y, to the second layer 180yq of the second passivation layer 180y. For example, the first passivation layer 180x in which the second contact hole 182 and the third contact hole 185b are formed, the first layer 180yp, and the second layer 180yq have increased etching speeds near the upper side. Accordingly, the second contact hole 182 is formed to have a positive taper structure. For example, a cross-sectional area of the second contact hole 182 widens from a lower side of the second contact hole 182 that contacts the data pad 179 to an upper side of the second contact hole 182, as shown in FIG. 5. Similarly, the third contact hole 185b is formed to have a positive taper structure. For example, a cross-sectional area of the third contact hole 185b widens from a lower side of the third contact hole 185b that contacts the drain electrode 175 to an upper side of the third contact hole 185b, as shown in FIG. 3.

As described above, in an exemplary embodiment, the plurality of insulating layers in which the contact holes 181, 182, and 185b are formed is formed such that an etching speed increases from a lower layer to an upper layer, resulting in the contact holes 181, 182, and 185b being formed to have a positive taper structure. Accordingly, the connecting members 81 and 82, which are formed to cover the contact holes 181, 182, and 185b or the second electric field generating electrode 191, may be prevented from being disconnected inside the contact holes 181, 182, and 185b. When the contact holes 181, 182, and 185b are formed in a reverse taper structure, the connecting members 81 and 82 or the second electric field generating electrode 191 may be formed only at upper portions of side walls of the contact holes 181, 182, and 185b having narrow cross-sectional areas, and may not be formed at lower portions of the side walls of the contact holes 181, 182, and 185b having wider cross-sectional areas. As a result, when a reverse taper structure is formed, the connecting members 81 and 82 formed to cover the contact holes 181, 182, and 185b or the second electric field generating electrode 191 may be disconnected inside the contact holes 181, 182, and 185b.

Further, the first passivation layer 180x may be formed as a single layer having an etching speed about the same as or slower than that of the first layer 180yp of the second passivation layer 180y. As a result, the cross-sectional area of the contact hole between the first passivation layer 180x and the second passivation layer 180y may be prevented from increasing. When the first passivation layer 180x is formed of a lower layer having a slower etching speed than that of an upper layer (e.g., see the second passivation layer 180y), the upper layer of the first passivation layer 180x may be excessively etched during the etching of the lower layer of the first passivation layer 180x. As a result, a cross-sectional area of the contact hole formed in the upper layer of the first passivation layer 180x may become wider than that of the contact hole formed in the first layer 180yp of the second passivation layer 180y. In this case, a conductive layer formed to cover the contact holes may be disconnected, and the first electric field generating electrode 131 disposed between the first passivation layer 180x and the second passivation layer 180y may be exposed.

According to an exemplary embodiment, the first passivation layer 180x may be formed as a single layer having an etching speed as about the same as or slower than that of the first layer 180yp of the second passivation layer 180y. As a result, the conductive layer may be prevented from being disconnected, and the first electric field generating electrode 131 may be prevented from being exposed.

Referring to FIG. 6, the common voltage line 125 is formed on the insulating layer 110. The common voltage line 125 is disposed in a peripheral area RA around the display area DA at which a plurality of pixels is disposed. The common voltage line 125 transmits a predetermined voltage, such as a common voltage Vcom, and may be disposed in at least one part of the peripheral area RA. The organic insulating layer 80 is not disposed in the peripheral area RA.

The end portion 132 of the first electric field generating electrode 131 formed in the peripheral area is exposed through a fourth contact hole 186a formed in the second passivation layer 180y, and the common voltage line 125 is exposed through a fifth contact hole 186b formed in the gate insulating layer 140, the first passivation layer 180x, and the second passivation layer 180y. A third connecting member 86 is formed on the end portion 132 of the first electric field generating electrode 131 exposed through the fourth contact hole 186a, the fifth contact hole 186b, and part of the common voltage line 125. Accordingly, the first field generating electrode 131 is connected with the common voltage line 125 disposed in the peripheral area around the display area through the fourth contact hole 186a and the fifth contact hole 186b to receive the common voltage.

As described above, the first electric field generating electrode 131 is connected to the common voltage line 125 through the fourth contact hole 186a and the fifth contact hole 186b to receive a common voltage, and the second electric field generating electrode 191 is connected with the drain electrode 175 through the third contact hole 185b to receive a data voltage.

The first electric field generating electrode 131 and the second electric field generating electrode 191 receiving the common voltage and the data voltage generate the electric field in the liquid crystal layer.

In an exemplary embodiment, the first electric field generating electrode 131 having a plate shape is disposed under the second passivation layer 180y, and the second electric field generating electrode 191 having the branch portion is disposed on the second passivation layer 180y. In an exemplary embodiment, the second electric field generating electrode 191 having the branch portion may be disposed under the second passivation layer 180y, and the first electric field generating electrode 131 having a plate shape may be disposed on the second passivation layer 180y. Further, either one of the first electric field generating electrode 131 and the second electric field generating electrode 191 may include a branch electrode, and the other electrode may have a plate shape. Further, either one of the first electric field generating electrode 131 and the second electric field generating electrode 191 may receive the common voltage, and the other electrode may receive the data voltage.

The characteristics described above may be applied to any thin film transistor array panel in which the two electric field generating electrodes, the common electrode, and the pixel electrode are all formed on the thin film transistor array panel.

A method of manufacturing a thin film transistor array panel according to an exemplary embodiment of the present invention will be described with reference to FIGS. 7 to 30. FIGS. 7 to 30 are cross-sectional views illustrating a method of manufacturing a thin film transistor array panel according to an exemplary embodiment of the present invention.

As illustrated in FIGS. 7 to 10, the gate lines 121 including the gate electrode 124 and the gate pad 129 are formed on the insulating substrate 110. In this case, the common voltage line disposed at the peripheral area may be simultaneously formed. Next, the gate insulating layer 140 is stacked on the gate line 121 and the common voltage line, the semiconductor 151 is stacked, and a layer forming the ohmic contact members is formed. The data conductor including the data line 171, the source electrode 173, the data pad 179, and the drain electrodes 175 is formed. The ohmic contact members 161, 163, 165, and 169 are completed by etching the layer forming the ohmic contact members using the data conductor as a mask, and the part of the protrusion 154 of the semiconductor 151 is exposed. The gate insulating layer 140 may be formed of an inorganic insulating material such as, for example, silicon nitride (SiNx) or silicon oxide (SiOx).

Referring to FIGS. 11 to 14, the first passivation layer 180x is stacked on the data conductors 171 and 175. The first passivation layer 180x may be formed of an inorganic insulating material such as, for example, silicon nitride (SiNx) or silicon oxide (SiOx). The first passivation layer 180x may be formed at a temperature lower than that of the gate insulating layer 140. Further, an etching speed of the first passivation layer 180x may be faster than that of the gate insulating layer 140.

Referring to FIGS. 15 to 18, the organic insulating layer 80 having the first opening 185a formed at a position corresponding to the drain electrode 175 is formed on a part of the first passivation layer 180x. The organic insulating layer 80 may include an organic material, and a surface of the organic insulating layer 80 may be generally flat. The organic insulating layer 80 is not disposed in the regions corresponding to the gate pad 129 and the data pad 179. The organic insulating layer 80 may be a color filter. When the organic insulating layer 80 is a color filter, the capping layer may be further formed on the organic insulating layer 80.

Referring to FIGS. 19 to 22, the first electric field generating electrode 131 having the second opening 138 formed at a position corresponding to the drain electrode 175 is formed on the organic insulating layer 80.

Referring to FIGS. 23 to 26, a second passivation layer 180y including the first layer 180yp and the second layer 180yq disposed on the first layer 180yp is formed on the first electric field generating electrode 131 and part of the first passivation layer 180x. The first layer 180yp may be formed at a temperature higher than that of the second layer 180yq. An etching speed of the second layer 180yq may be faster than that of the first layer 180yp. The first layer 80yp may be formed at a temperature about the same as or lower than that of the first passivation layer 180x. The etching speed of the first layer 180yp may be faster than that of the first passivation layer 180x. Further, the first passivation layer 180x may be formed as a single layer having an etching speed about the same as or slower than that of the first layer 180yp. As described above, the cross-sectional areas of the contact holes between the first passivation layer 180x and the second passivation layer 180y may be prevented from being widened by forming the first passivation layer 180x as a single layer having an etching speed about the same as or slower than that of the first layer 180yp. When the first passivation layer 180x is formed of a lower layer having a slower etching speed than an upper layer (e.g., see the second passivation layer 180y), the upper layer of the first passivation layer 180x may be excessively etched during etching of the lower layer of the first passivation layer 180x. As a result, the cross-sectional area of the contact hole formed in the upper layer of the first passivation layer 180x may become wider than that of the contact hole formed in the first layer 180yp of the second passivation layer 180y. In this case, a conductive layer formed to cover the contact holes may be disconnected, and the first electric field generating electrode 131 disposed between the first passivation layer 180x and the second passivation layer 180y may be exposed.

According to an exemplary embodiment, the first passivation layer 180x may be formed as a single layer having an etching speed about the same as or slower than that of the first layer 180yp of the second passivation layer 180y. As a result, the conductive layer may be prevented from being disconnected, and the first electric field generating electrode 131 may be prevented from being exposed.

Further, a ratio of nitrogen within the second passivation layer 180y may be formed to be higher than that of nitrogen within the first passivation layer 180x. For example, when the first passivation layer 180x and the second passivation layer 180y include nitride silicon, a ratio of the number of combinations [N—H] of nitrogen and hydrogen to the number of combinations [Si—H] of silicon and hydrogen within the second passivation layer 180y (e.g., a value of [N—H]/[Si—

H]), may be larger than a ratio of the number of combinations of nitrogen and hydrogen to the number of combinations [Si—H] of silicon and hydrogen within the first passivation layer 180x (e.g., a value of [N—H]/[Si—H]). Further, the value of [N—H]/[Si—H](e.g., the ratio of the number of combinations [N—H] of nitrogen and hydrogen to the number of combinations [Si—H] of silicon and hydrogen) within the first layer 180yp of the second passivation layer 180y may be formed such that it is about the same as or larger than the value of [N—H]/[Si—H] of the first passivation layer 180x. Further, the value of [N—H]/[Si—H] within the second layer 180yq of the second passivation layer 180y may be formed such that it is larger than the value of [N—H]/[Si—H] of the first layer 180yp of the second passivation layer 180y.

As illustrated in FIGS. 27 to 30, the first contact hole 181 exposing part of the gate pad 129, the second contact hole 182 exposing part of the data pad 179, and the third contact hole 185b exposing part of the drain electrode 175 are formed by sequentially etching the second layer 180yq of the second passivation layer 180y, the first layer 180yp of the second passivation layer 180y, the first passivation layer 180x, and the gate insulating layer 140. In this case, as illustrated in FIG. 6, the fourth contact hole 186a exposing the end portion 132 of the first electric field generating electrode 131 formed in the peripheral area RA may be formed in the second passivation layer 180y, and the fifth contact hole 186b exposing part of the common voltage line 125 may be formed in the first passivation layer 180x and the second passivation layer 180y.

As described above, during manufacture according to an exemplary embodiment, the gate insulating layer 140 may be formed at a temperature higher than that of the first passivation layer 180x, and may be formed to have an etching speed slower than that of the first passivation layer 180x. Further, the first layer 180yp of the second passivation layer 180y may be formed at a temperature about the same as or lower than that of the first passivation layer 180x, and may be formed to have an etching speed about the same as or higher than that of the first passivation layer 180x. Further, the second layer 180yq of the second passivation layer 180y may be formed at a temperature lower than that of the first layer 180yp of the second passivation layer 180y, and may be formed to have an etching speed higher than that of the second passivation layer 180y.

That is, the etching speed is increased from the gate insulating layer 140, to the first passivation layer 1800x, to the first layer 180yp of the second passivation layer 180y, and to the second layer 180yq of the second passivation layer 180y. Accordingly, the first contact hole 181, the second contact hole 182, the third contact hole 185b, the fourth contact hole 186a, and the fifth contact hole 186b may be formed to have a positive taper structure in which the cross-sectional areas thereof are widened from the lower side to the upper side.

Further, in an exemplary embodiment, the first passivation layer 180x may be formed as a single layer having an etching speed about the same as or slower than that of the first layer 180yp of the second passivation layer 180y. As described above, as a result, the cross-sectional area of the contact hole between the first passivation layer 180x and the second passivation layer 180y may be prevented from increasing. When the first passivation layer 180x is formed of a lower layer having a slower etching speed than an upper layer (e.g., the second passivation layer 180y), the upper layer of the first passivation layer 180x may be excessively etched during etching of the lower layer of the first passivation layer 180x. As a result, a cross-sectional area of the contact hole formed in the upper layer of the first passivation layer 180x may become wider than that of the contact hole formed in the first layer 180yp of the second passivation layer 180y. In this case, a conductive layer formed to cover the contact holes may be disconnected, and the first electric field generating electrode 131 disposed between the first passivation layer 180x and the second passivation layer 180y may be exposed. According to an exemplary embodiment, the first passivation layer 180x may be formed as a single layer having an etching speed about the same as or slower than that of the first layer 180yp of the second passivation layer 180y. As a result, the conductive layer may be prevented from being disconnected, and the first electric field generating electrode 131 may be prevented from being exposed.

Further, the organic insulating layer 80 may not be formed in regions in which the first contact hole 181, the second contact hole 182, the third contact hole 185b, the fourth contact hole 186a, and the fifth contact hole 186b are formed. Accordingly, the first contact hole 181, the second contact hole 182, the third contact hole 185b, the fourth contact hole 186a, and the fifth contact hole 186b are formed in the gate insulating layer 140, the first passivation layer 180x, and the second passivation layer 180y, which have a relatively thin thickness compared to the organic insulating layer 80, in which the contact holes are not formed. Accordingly, the etching time may be decreased when the first contact hole 181, the second contact hole 182, the third contact hole 185b, the fourth contact hole 186a, and the fifth contact hole 186b are formed. As a result, the cross-sectional areas of the contact holes may be prevented from being widened due to increased etching time.

Further, the first passivation layer 180x may be formed as a single layer having an etching speed about the same as or slower than that of the first layer 180yp of the second passivation layer 180y. As a result, the cross-sectional areas of the contact holes between the first passivation layer 180x and the second passivation layer 180y may be prevented from increasing.

As illustrated in FIGS. 1 to 6, in an exemplary embodiment, the second electric field generating electrode 191, the first connecting member 81, and the second connecting member 82 are formed on the second passivation layer 180y.

The first connecting member 81 covers the gate pad 129 exposed through the first contact hole 181, and the second connecting member 82 covers the data pad 179 exposed through the second contact hole 182.

The second field generating electrode 191 covers the drain electrode 175 exposed through the third contact hole 185b, and is physically and electrically connected with the drain electrode 175.

The third connecting member 86 covers the end portion 132 of the first electric field generating electrode 131 exposed through the fourth contact hole 186a and the common voltage line 125 exposed through the fifth contact hole 186b, and electrically connects the first electric field generating electrode 131 and the common voltage line 125.

An experimental example of the present invention will be described with reference to Table 1. In the experimental example, the first passivation layer 180x is formed at a temperature higher than that of the second passivation layer 180y, and is formed as a single layer having an etching speed about the same as or slower than that of the first layer 180yp of the second passivation layer 180y. Further, the second layer 180yq of the second passivation layer 180y is formed so as to have an etching speed higher than that of the first layer 180yp of the second passivation layer 180y.

Table 1 below represents a film forming condition of a first layer forming the first passivation layer 180x, a film forming condition of a second layer forming the first layer 180yp of the second passivation layer 180y, a film forming condition of a third layer forming the second layer 180yq of the second passivation layer 180y, and the etching speeds when the respective layers are dry etched under the same condition.

TABLE 1

|  | Power (W) | Pressure (T) | N2 (sccm) | NH$_3$ (sccm) | SiH$_4$ (sccm) | Temperature (°C.) | Relative etching speed |
|---|---|---|---|---|---|---|---|
| First layer | 6110 | 1300 | 16840 | 7210 | 1771 | 285 | 4117 |
| Second layer | 6110 | 1500 | 16840 | 7210 | 1610 | 270 | 4740 |
| Third layer | 4330 | 1800 | 28100 | 4810 | 480 | 270 | 8153 |

Referring to Table 1, the etching speed is increased from the first layer forming the first passivation layer 180x, to the second layer forming the first layer 180yp of the second passivation layer 180y, to the third layer forming the second layer 180yq of the second passivation layer 180y by adjusting the film forming condition of the first layer forming the first passivation layer 180x, the film forming condition of the second layer forming the first layer 180yp of the second passivation layer 180y, and the film forming condition of the third layer forming the second layer 180yq of the second passivation layer 180y.

Figure 31:
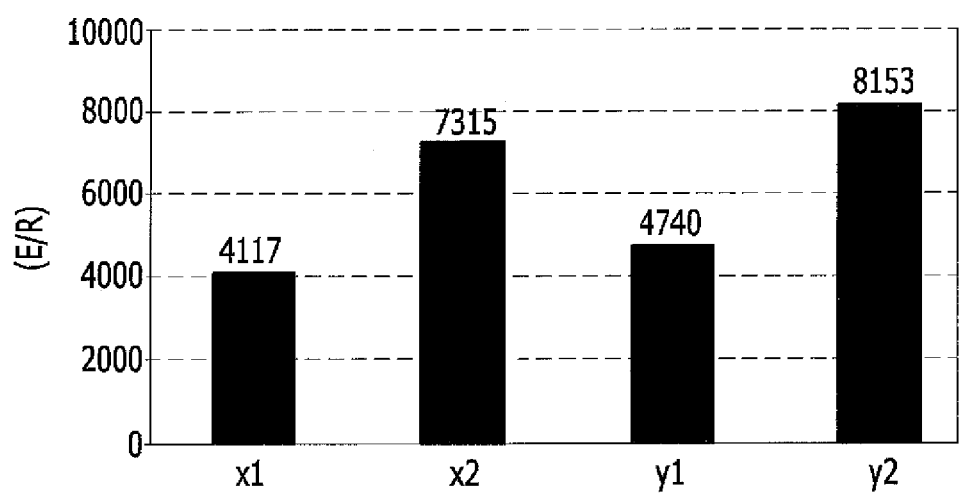
FIG. 31 is a graph illustrating an etching speed of a passivation layer, according to an experimental example of the present invention.

An experimental example of the present invention will be described with reference to FIGS. 31 to 33. FIG. 31 is a graph illustrating an etching speed of the passivation layer, according to an experimental example of the present invention. FIGS. 32 and 33 illustrate a cross-section of a contact hole, according to an experimental example of the present invention.

In the experimental example described with reference to FIGS. 31 to 33, the first passivation layer 180x is formed as a bi-layer including a lower layer having a slower etching speed than an upper layer (e.g., see the second passivation layer 180y), and the etching speeds of the respective layers are measured. The measured etching speeds are shown in FIG. 31.

Figure 32A:
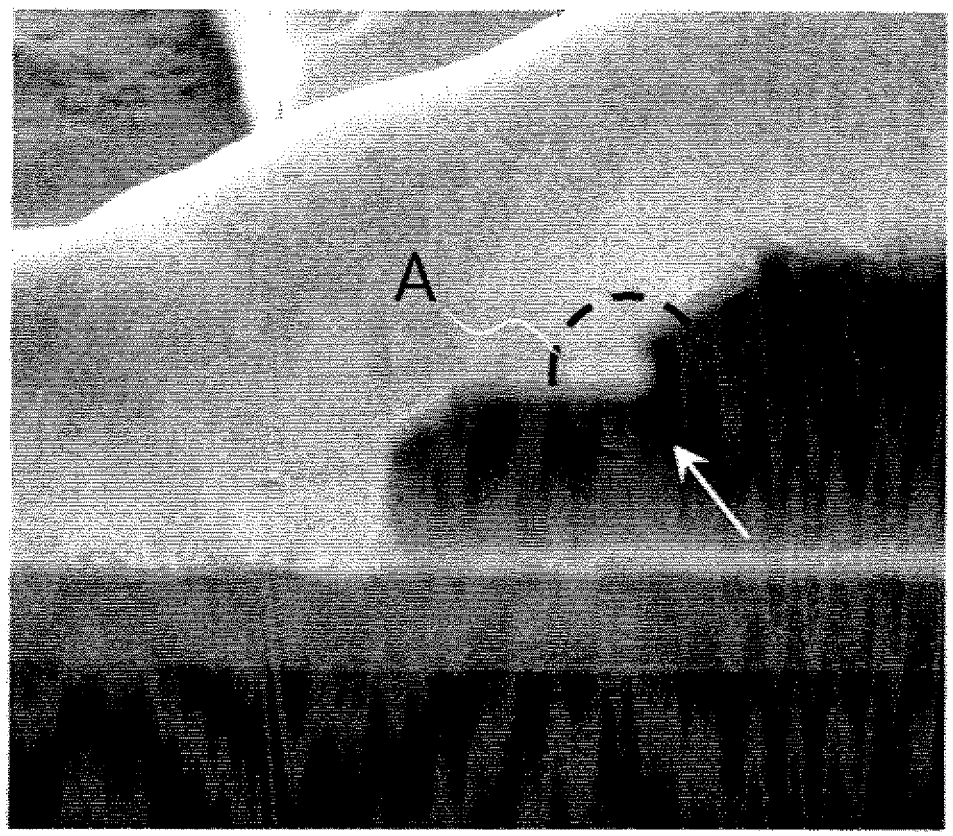
FIGS. 32A-B and 33A-B illustrate a cross-section of a contact hole, according to an experimental example of the present invention.
Figure 32B:
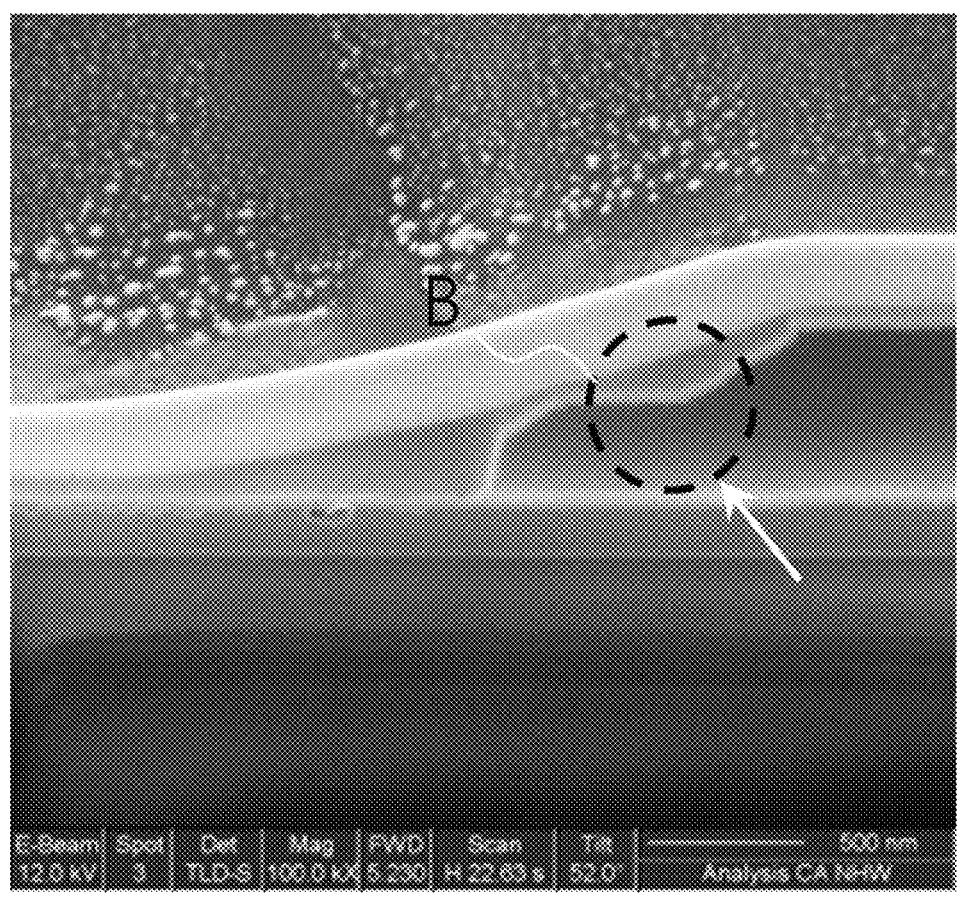
Figure 33A:
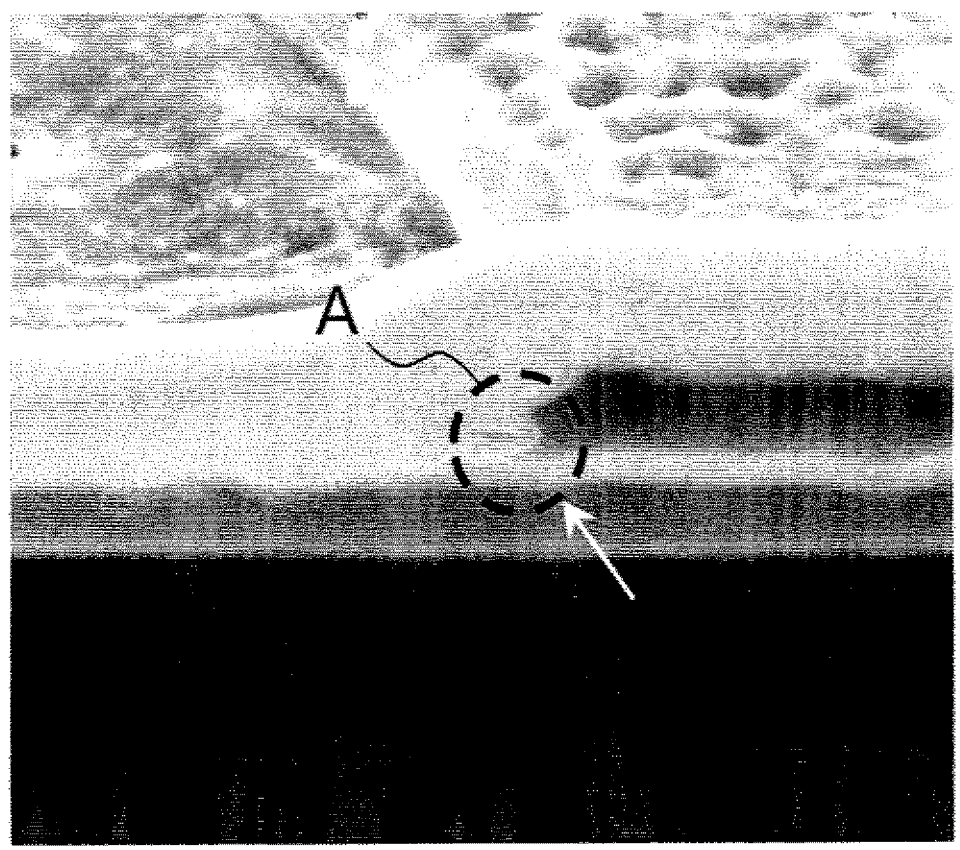
Figure 33B:
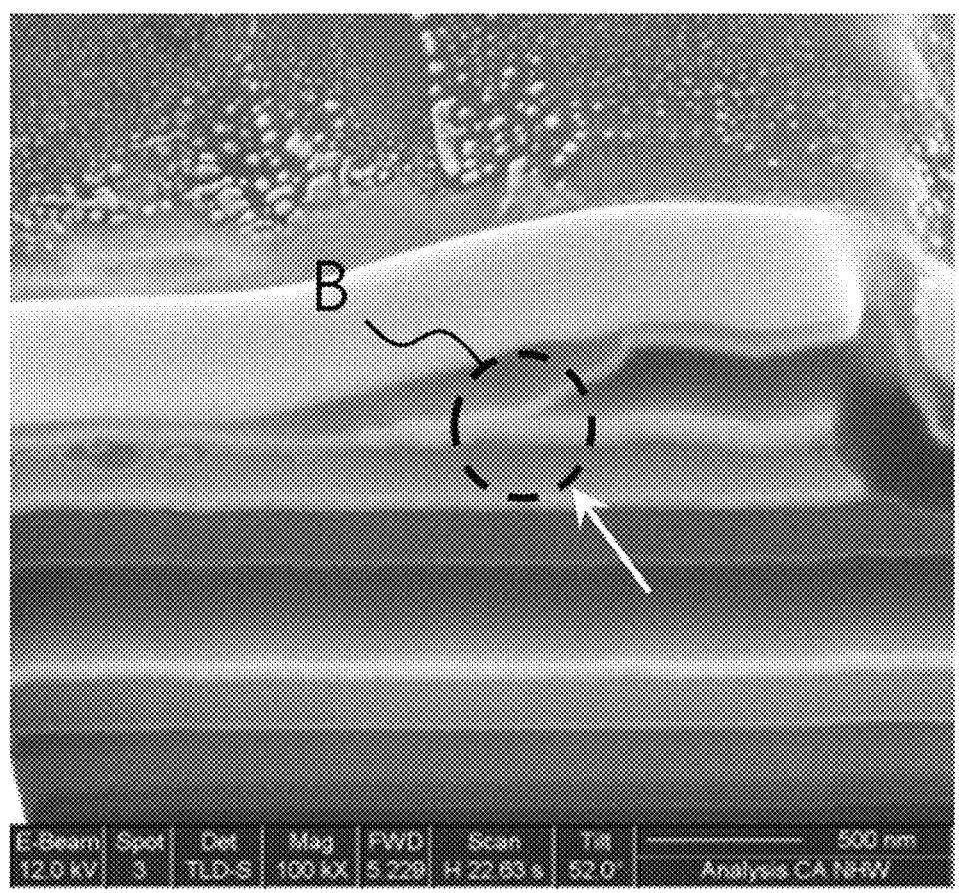

FIGS. 32A-B and 33A-B show cross-sections of formed contact holes. FIGS. 32A and 33A refer to formation in a first case, case A, and FIGS. 32B and 33B refer to formation in a second case, case B. In case A, the first passivation layer 180x is formed as a bi-layer including a lower layer having a slower etching speed than an upper layer (e.g., see the second passivation layer 180y). In case B, the first passivation layer 180x is formed as a single layer having an etching speed slower than that of the first layer 180yp of the second passivation layer 180y. FIGS. 32A and 32B illustrate the contact holes exposing the gate conductor, and FIGS. 33A and 33B illustrate the contact holes exposing the data conductor.

Referring to FIG. 31, when each passivation layer includes the lower layer having a fast etching speed and the upper layer having a slow etching speed (e.g., the first passivation layer 180x is formed as the bi-layer including the lower layer having the slow etching speed and the upper layer having the high etching speed, similar to the second passivation layer 180y), the etching speed of the lower layer x1 of the first passivation layer 180x is slower than that of the upper layer x2 of the first passivation layer 180x. Further, the etching speed of the lower layer y1 of the second passivation layer 180y is slower than that of the upper layer y2 of the second passivation layer 180y. Further, the etching speed of the upper layer x2 of the first passivation layer 180x is faster than that of the lower layer y1 of the second passivation layer 180y.

Accordingly in FIG. 31, it can be seen that the etching speed is not gradually increased from the lower portion of the first passivation layer 180x and the second passivation layer 180y, in which the contact holes are formed, to the upper portion. Thus, the upper layer x2 of the first passivation layer 180x may be over-etched because the upper layer x2 of the first passivation layer 180x having the fast etching speed exists between the lower layer x1 of the first passivation layer 180x and the lower layer y1 of the second passivation layer 180y.

Referring to FIGS. 32A and 33A, in case A where the first passivation layer 180x is formed as a bi-layer including a lower layer having a slow etching speed and the upper layer having a relatively faster etching speed (e.g., see the second passivation layer 180y), a portion in which the cross-sectional area of the contact hole is widened by the over-etching is indicated by portions A shown in FIGS. 32A and 33A.

However, referring to FIGS. 32B and 33B, in case B in which the first passivation layer 180x is formed as a single layer having an etching speed slower than that of the first layer 180yp of the second passivation layer 180y, the contact hole formed has a positive taper structure in which a cross-sectional area becomes wider from the lower side to the upper side.

As described above, according to exemplary embodiments of the present invention, an increase in the cross-sectional areas of the contact holes between the first passivation layer 180x and the second passivation layer 180y may be prevented by forming the first passivation layer 180x as a single layer having an etching speed about the same as or slower than that of the first layer 180yp of the second passivation layer 180y.

According to exemplary embodiments of the present invention, any one of two electric field generating electrodes overlapping each other may have a plate shape, and the other field generating electrode may have the branch portion, however exemplary embodiments including two electric field generating electrodes are not limited thereto.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A thin film transistor array panel, comprising:
a substrate;
a plurality of gate lines disposed on the substrate, wherein each gate line comprises a gate pad;
a gate insulating layer disposed on the plurality of gate lines;
a plurality of data lines disposed on the gate insulating layer, wherein each data line comprises a data pad connected to a source electrode and a drain electrode;
a first passivation layer disposed on the plurality of data lines and the drain electrode;
a first electric field generating electrode disposed on the first passivation layer;
a second passivation layer disposed on the first electric field generating electrode; and
a second electric field generating electrode disposed on the second passivation layer,
wherein the first passivation layer and the second passivation layer are inorganic materials, and the gate insulating layer, the first passivation layer, and the second passivation layer comprise a first contact hole exposing a part of the gate pad, the first passivation layer and the second passivation layer comprise a second contact hole exposing a part of the data pad, and at least one of the first contact hole and the second contact hole have a positive taper structure having a wider area at an upper side than at a lower side.

2. The thin film transistor array panel of claim 1, wherein:
at least one of the gate insulating layer, the first passivation layer, and the second passivation layer comprises a lower layer and an upper layer disposed on the lower layer, and
an area of a contact hole in the upper layer is larger than an area of a contact hole in the lower layer, wherein the contact hole is the first contact hole, the second contact hole, or a third contact hole.

3. The thin film transistor array panel of claim 2, wherein:
the first passivation layer is a single layer.

4. The thin film transistor array panel of claim 3, wherein:
the second passivation layer is a bi-layer comprising the lower layer and the upper layer.

5. The thin film transistor array panel of claim 4, wherein:
an etching speed of the first passivation layer is about equal to or slower than an etching speed of the lower layer of the second passivation layer, and the etching speed of the lower layer of the second passivation layer is slower than an etching speed of the upper layer of the second passivation layer.

6. The thin film transistor array panel of claim 5, wherein:
an etching speed of the gate insulating layer is slower than the etching speed of the first passivation layer.

7. The thin film transistor array panel of claim 4, wherein:
a ratio of a combination concentration of nitrogen and hydrogen to a combination concentration of silicon and hydrogen of the first passivation layer is about equal to or smaller than a ratio of a combination concentration of nitrogen and hydrogen to a combination concentration of silicon and hydrogen of the lower layer of the second passivation layer, and
the ratio of a combination concentration of nitrogen and hydrogen to a combination concentration of silicon and hydrogen of the lower layer of the second passivation layer is smaller than a ratio of a combination concentration of nitrogen and hydrogen to a combination concentration of silicon and hydrogen of the upper layer of the second passivation layer.

8. The thin film transistor array panel of claim 2, further comprising:
an organic layer disposed between the first passivation layer and the first electric field generating electrode, wherein
the organic layer is not disposed in regions corresponding to the gate pad and the data pad.

9. The thin film transistor array panel of claim 1, wherein:
the first passivation layer and the second passivation layer comprise a drain electrode contact hole exposing a part of the drain electrode,
the second electric field generating electrode is connected with the drain electrode through the drain electrode contact hole, and
the drain electrode contact hole has a positive taper structure having a wider area at an upper side than at a lower side.

10. The thin film transistor array panel of claim 9, wherein:
at least one of the gate insulating layer, the first passivation layer, and the second passivation layer comprises a lower layer and an upper layer disposed on the lower layer, and
an area of a contact hole in the upper layer is larger than an area of the contact hole in the lower layer, wherein the contact hole is the first contact hole, the second contact hole, or a third contact hole.

11. The thin film transistor array panel of claim 10, wherein:
the first passivation layer is a single layer.

12. The thin film transistor array panel of claim 11, wherein:
the second passivation layer is a bi-layer comprising the lower layer and the upper layer.

13. The thin film transistor array panel of claim 12, wherein:
an etching speed of the first passivation layer is about equal to or slower than an etching speed of the lower layer of the second passivation layer, and the etching speed of the lower layer of the second passivation layer is slower than an etching speed of the upper layer of the second passivation layer.

14. The thin film transistor array panel of claim 13, wherein:
an etching speed of the gate insulating layer is slower than the etching speed of the first passivation layer.

15. The thin film transistor array panel of claim 13, wherein:
a ratio of a combination concentration of nitrogen and hydrogen to a combination concentration of silicon and hydrogen of the first passivation layer is about equal to or smaller than a ratio of a combination concentration of nitrogen and hydrogen to a combination concentration of silicon and hydrogen of the lower layer of the second passivation layer, and
the ratio of a combination concentration of nitrogen and hydrogen to a combination concentration of silicon and hydrogen of the lower layer of the second passivation layer is smaller than a ratio of a combination concentration of nitrogen and hydrogen to a combination concentration of silicon and hydrogen of the upper layer of the second passivation layer.

16. The thin film transistor array panel of claim 9, further comprising:
an organic layer disposed between the first passivation layer and the first electric field generating electrode, wherein
the organic layer comprises an opening surrounding the drain electrode contact hole.

17. A thin film transistor array panel, comprising:
a substrate;
a plurality of gate lines disposed on the substrate, wherein each gate line comprises a gate pad;
a gate insulating layer disposed on the plurality of gate lines;
a plurality of data lines disposed on the gate insulating layer, wherein each data line comprises a data pad connected to a source electrode and a drain electrode;
a first passivation layer disposed on the plurality of data lines and the drain electrode;
a first electric field generating electrode disposed on the first passivation layer;
a second passivation layer disposed on the first electric field generating electrode; and
a second electric field generating electrode disposed on the second passivation layer, wherein
a ratio of a combination concentration of nitrogen and hydrogen to a combination concentration of silicon and hydrogen of the first passivation layer is larger than a ratio of a combination concentration of nitrogen and hydrogen to a combination concentration of silicon and hydrogen of the second passivation layer.

18. The thin film transistor array panel of claim 17, wherein:
the first passivation layer is a single layer, and
the second passivation layer is a bi-layer comprising a lower layer and an upper layer disposed on the lower layer.

19. The thin film transistor array panel of claim 18, wherein:
the ratio of a combination concentration of nitrogen and hydrogen to a combination concentration of silicon and hydrogen of the first passivation layer is about equal to or smaller than a ratio of a combination concentration of nitrogen and hydrogen to a combination concentration of silicon and hydrogen of the lower layer of the second passivation layer, and
the ratio of a combination concentration of nitrogen and hydrogen to a combination concentration of silicon and hydrogen of the lower layer of the second passivation layer is smaller than a ratio of a combination concentration of nitrogen and hydrogen to a combination concentration of silicon and hydrogen of the upper layer of the second passivation layer.

* * * * *